United States Patent
Hsieh et al.

(10) Patent No.: US 12,165,936 B2
(45) Date of Patent: Dec. 10, 2024

(54) END POINT CONTROL IN ETCHING PROCESSES

(71) Applicant: Taiwan Semiconductor Manufacturing Co., Ltd., Hsinchu (TW)

(72) Inventors: Jui Fu Hsieh, Zhubei (TW); Chia-Chi Yu, New Taipei (TW); Chih-Teng Liao, Hsinchu (TW); Yi-Jen Chen, Hsinchu (TW); Chia-Cheng Tai, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 138 days.

(21) Appl. No.: 17/648,836

(22) Filed: Jan. 25, 2022

(65) Prior Publication Data

US 2023/0009031 A1    Jan. 12, 2023

Related U.S. Application Data

(60) Provisional application No. 63/219,418, filed on Jul. 8, 2021.

(51) Int. Cl.
*H01L 21/66* (2006.01)
*H01L 21/311* (2006.01)

(52) U.S. Cl.
CPC ........ *H01L 22/26* (2013.01); *H01L 21/31116* (2013.01)

(58) Field of Classification Search
None
See application file for complete search history.

(56) References Cited

U.S. PATENT DOCUMENTS

| | | | |
|---|---|---|---|
| 6,650,426 B1* | 11/2003 | Zalicki | H01J 37/32963 356/626 |
| 11,501,986 B2 | 11/2022 | Cheung et al. | |
| 11,522,083 B2 | 12/2022 | Lian et al. | |
| 2011/0253671 A1 | 10/2011 | Lian et al. | |
| 2012/0003759 A1* | 1/2012 | Hu | B24B 37/013 257/E21.53 |
| 2020/0091142 A1 | 3/2020 | Ching et al. | |

FOREIGN PATENT DOCUMENTS

| | | |
|---|---|---|
| DE | 102019126237 A1 | 4/2020 |
| DE | 102019118613 A1 | 6/2020 |
| EP | 1611447 B1 | 1/2011 |
| TW | 201740463 A | 11/2017 |
| TW | 202117816 A | 5/2021 |
| WO | 2020131646 A1 | 6/2020 |

\* cited by examiner

*Primary Examiner* — Roberts P Culbert
(74) *Attorney, Agent, or Firm* — Slater Matsil, LLP

(57) ABSTRACT

A method includes determining a target etching depth for etching a plurality of dielectric regions in a wafer. The wafer includes a plurality of protruding semiconductor fins and the plurality of dielectric regions between the plurality of protruding semiconductor fins. The method further includes etching the plurality of dielectric regions, projecting a light beam on the wafer, and generating a spectrum from a reflected light reflected from the wafer, determining an end point for etching based on the spectrum. The end point is an expected time point. The plurality of dielectric regions are etched to the target etching depth. The etching of the plurality of dielectric regions is stopped at the end point.

20 Claims, 26 Drawing Sheets

END POINT CONTROL IN ETCHING PROCESSES

PRIORITY CLAIM AND CROSS-REFERENCE

This application claims the benefit of the following provisionally filed U.S. Patent application: Application No. 63/219,418, filed on Jul. 8, 2021, and entitled "Epitaxial Source/Drain Shaping by Hybrid Fin Height Control via High-k Etching Novel Reflected Spectrum End Point Control," which application is hereby incorporated herein by reference.

BACKGROUND

With the increasing down-scaling of integrated circuits and the increasingly demanding requirements to the speed of integrated circuits, transistors need to have higher drive currents with increasingly smaller dimensions. Fin Field-Effect Transistors (FinFET) were thus developed. The FinFETs include vertical semiconductor fins above a substrate. The semiconductor fins are used to form source and drain regions, and to form channel regions between the source and drain regions. Shallow Trench Isolation (STI) regions are formed to define the semiconductor fins. The FinFETs also include gate stacks, which are formed on the sidewalls and the top surfaces of the semiconductor fins.

In the formation of the STI regions and the formation of the FinFETs, STI regions are first formed, for example, using flowable oxide, followed by a post treatment using either Ultra-Violet (UV) curing or thermal oxidation in an oxygen-containing environment. The respective wafer is then annealed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
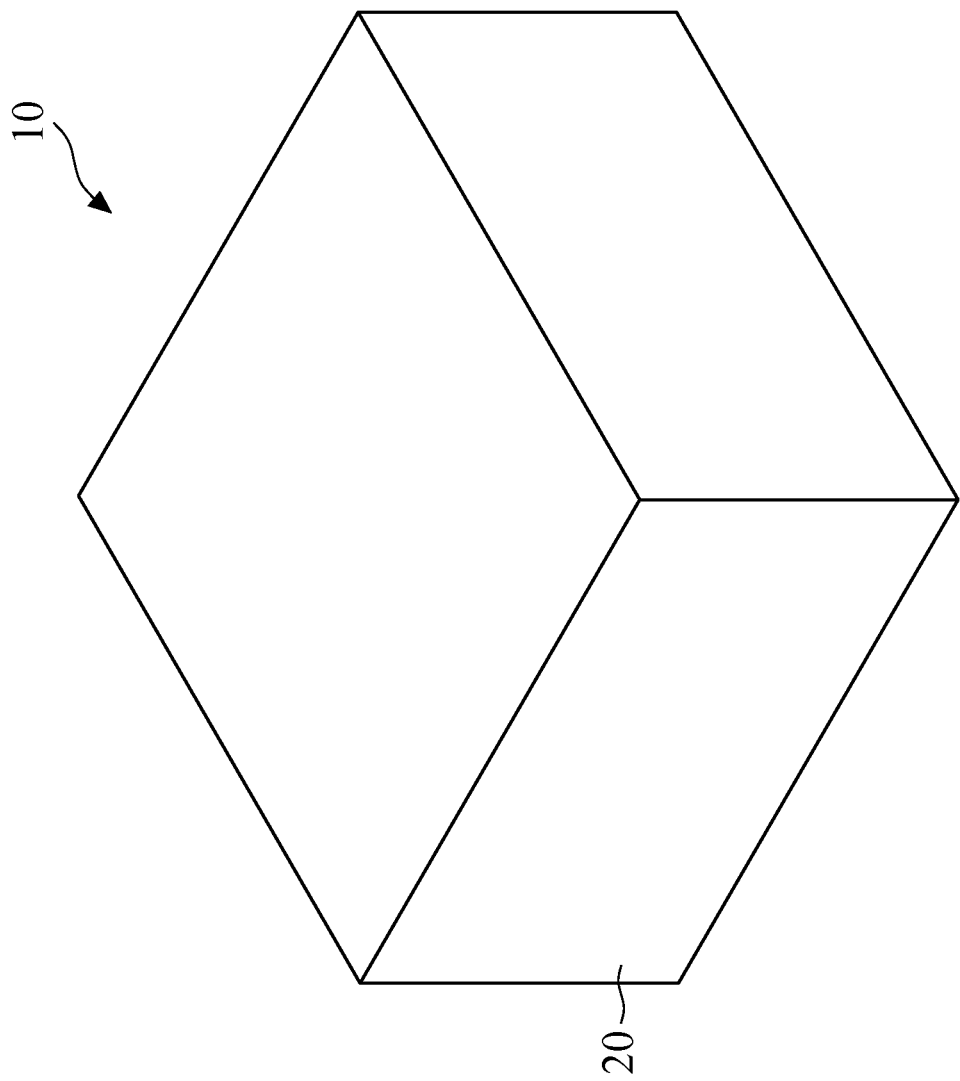
FIGS. 1-5, 6A, 6B, 7A, 7B, 8A, 8B, 9, 10A, 10B, and 10C illustrate the perspective views and cross-sectional views of intermediate stages in the formation of dielectric fins, semiconductors fins, and epitaxy regions in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Fin Field-Effect Transistors (FinFETs) including dielectric fins and the corresponding formation processes are provided. The end-point detection for the etching of the dielectric fins is provided. In accordance with some embodiments of the present disclosure, semiconductor fins are formed, and dielectric fins are formed between the semiconductor fins to control the profile of the epitaxy source/drain regions of the corresponding FinFET. The height of dielectric fins affects the profile of the epitaxy source/drain regions. Accordingly, the height of the dielectric fins are controlled by controlling the end points in the etching of the dielectric fins. In accordance with some embodiments, the end points are determined by projecting a light beam on the respective wafer, generating a spectrum from the reflective light beam, and determining the end point from the spectrum. It is appreciated that although the end-point determination in the etching of dielectric fins is discussed as an example, the embodiments of the present disclosure may also be used in the end-point determination in the etching of other features including, and not limited to, semiconductor regions, metallic regions, or the like. Furthermore, the embodiments of the present disclosure may also be used in the end-point determination in the selective growth of dielectric regions, semiconductor regions, metallic regions, or the like. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

Figure 20:
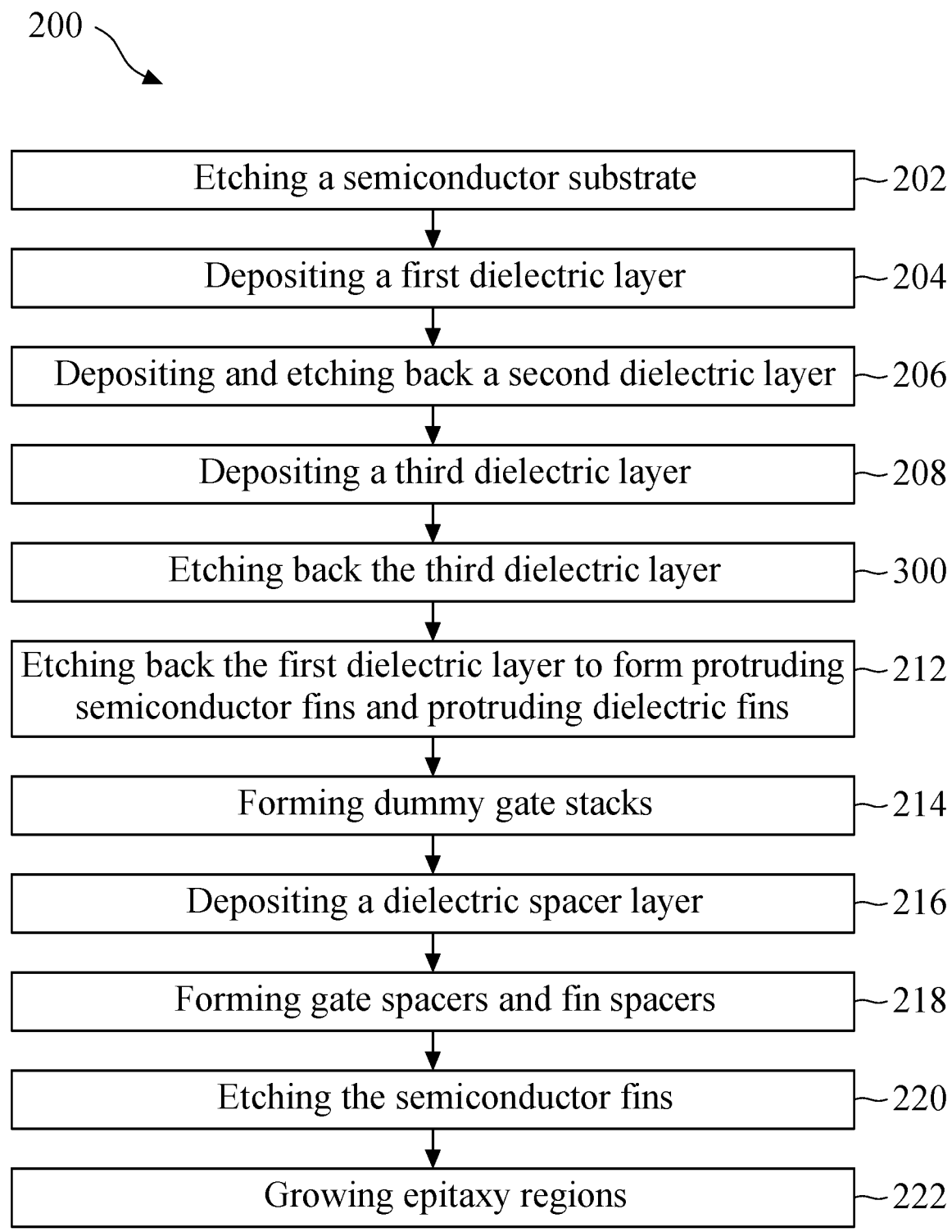
FIG. 20 illustrates a process flow for forming a Fin Field-Effect Transistors (FinFET) in accordance with some embodiments.

FIGS. 1-5, 6A, 6B, 7A, 7B, 8A, 8B, 9, 10A, 10B, and 10C illustrate the cross-sectional views of intermediate stages in the formation of FinFETs including dielectric fins in accordance with some embodiments of the present disclosure. The corresponding processes are also reflected schematically in the process flow 200 as shown in FIG. 20.

Referring to FIG. 1, substrate 20 is provided. The substrate 20 may be a semiconductor substrate, such as a bulk semiconductor substrate, a Semiconductor-On-Insulator (SOI) substrate, or the like, which may be doped (e.g., with a p-type or an n-type dopant) or undoped. The semiconductor substrate 20 may be a part of wafer 10, such as a silicon wafer. Generally, an SOI substrate is a layer of a semiconductor material formed on an insulator layer. The insulator layer may be, for example, a Buried Oxide (BOX) layer, a silicon oxide layer, or the like. The insulator layer is provided on a substrate, typically a silicon or glass substrate. Other substrates such as a multi-layered or gradient substrate may also be used. In some embodiments, the semiconductor material of semiconductor substrate 20 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Figure 2:
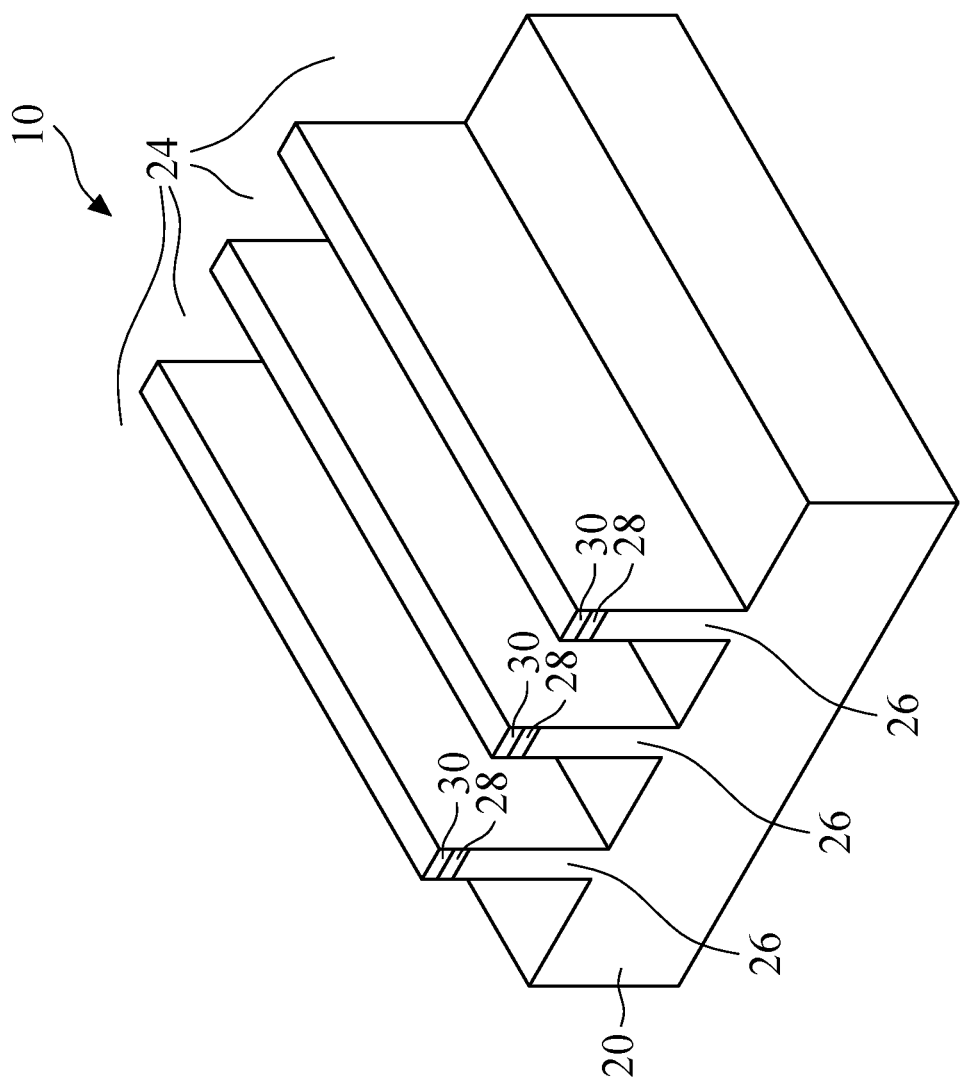

Referring to FIG. 2, substrate 20 is etched to form trenches 24. The respective process is illustrated as process 202 in the process flow 200 shown in FIG. 20. The portions of substrate 20 between neighboring trenches 24 are referred to as semiconductor strips 26. To form trenches 24, pad oxide layer 28 and hard mask layer 30 are formed on semiconductor substrate 20, and are then patterned. Pad oxide layer 28 may be a thin film formed of silicon oxide. In accordance with some embodiments of the present disclosure, pad oxide layer 28 is formed in a thermal oxidation process, wherein a top surface layer of semiconductor substrate 20 is oxidized.

In accordance with some embodiments of the present disclosure, hard mask layer 30 is formed of silicon nitride, for example, using Low-Pressure Chemical Vapor Deposition (LPCVD), Plasma Enhanced Chemical Vapor Deposition (PECVD), Atomic Layer Deposition (ALD), or the like. A photoresist (not shown) is formed on hard mask layer 30 and is then patterned. Hard mask layer 30 is then patterned using the patterned photoresist as an etching mask to form hard masks 30 as shown in FIG. 2. Next, the patterned hard mask layer 30 is used as an etching mask to etch pad oxide layer 28 and substrate 20, forming trenches 24.

Figure 3:
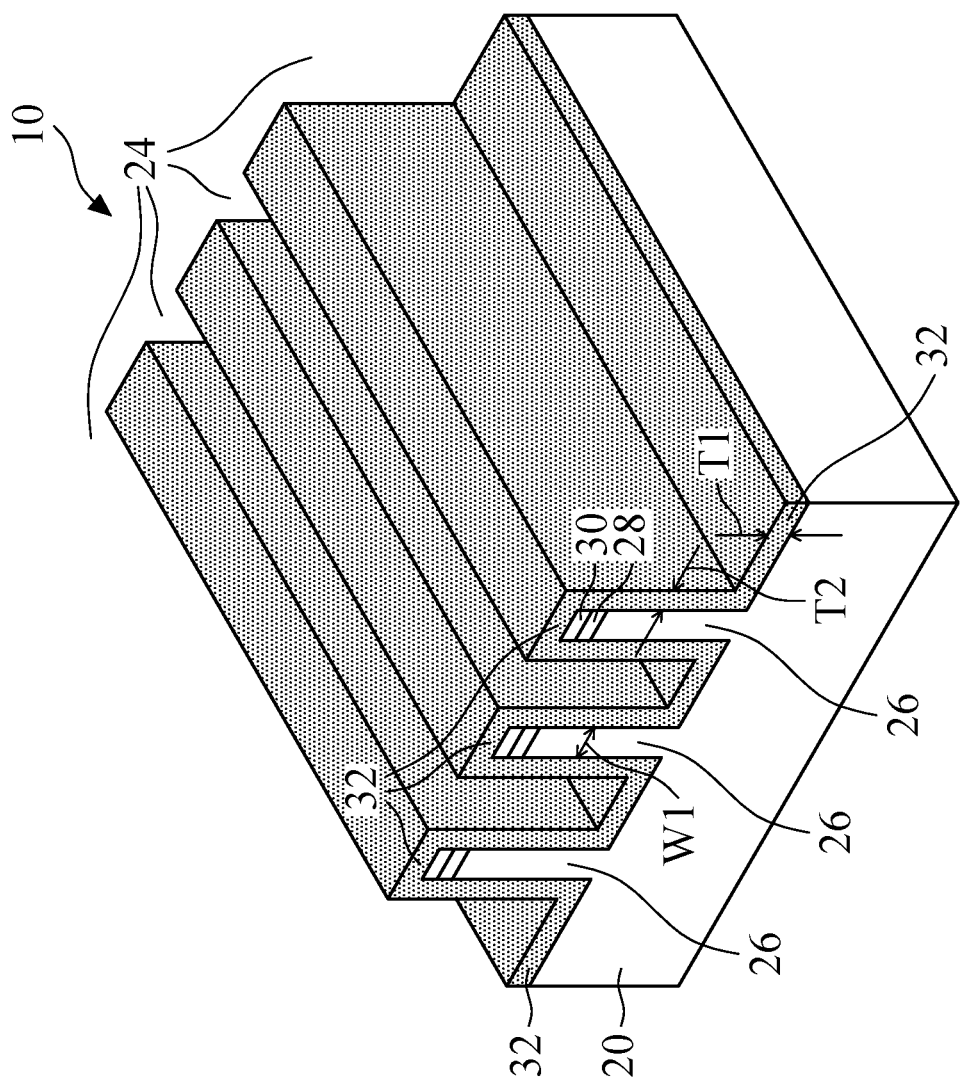

Referring to FIG. 3, dielectric layer 32 is deposited. The respective process is illustrated as process 204 in the process flow 200 shown in FIG. 20. In accordance with some embodiments of the present disclosure, dielectric layer 32 is formed using a conformal deposition process such as ALD, Chemical Vapor Deposition (CVD), or the like. Accordingly, the thickness T1 of the horizontal portions and thickness T2 of the vertical portions of dielectric layer 32 are equal to or substantially equal to each other, for example, with a variation smaller than about 10 percent. The material of dielectric layer 32 may be selected from silicon oxide, silicon nitride, silicon oxynitride, silicon oxy-carbo-nitride, hafnium oxide, zirconium oxide, aluminum oxide, and the like. The thickness T2 (and T1) of dielectric layer 32 may be greater than about 5 nm, and may be in the range between about 5 nm and about 25 nm. Furthermore, thickness T2 (and T1) may be comparable with the width W1 of semiconductor strips 26, for example, with ratio T1/W1 in the range between about 0.3 and about 3.

Figure 4:
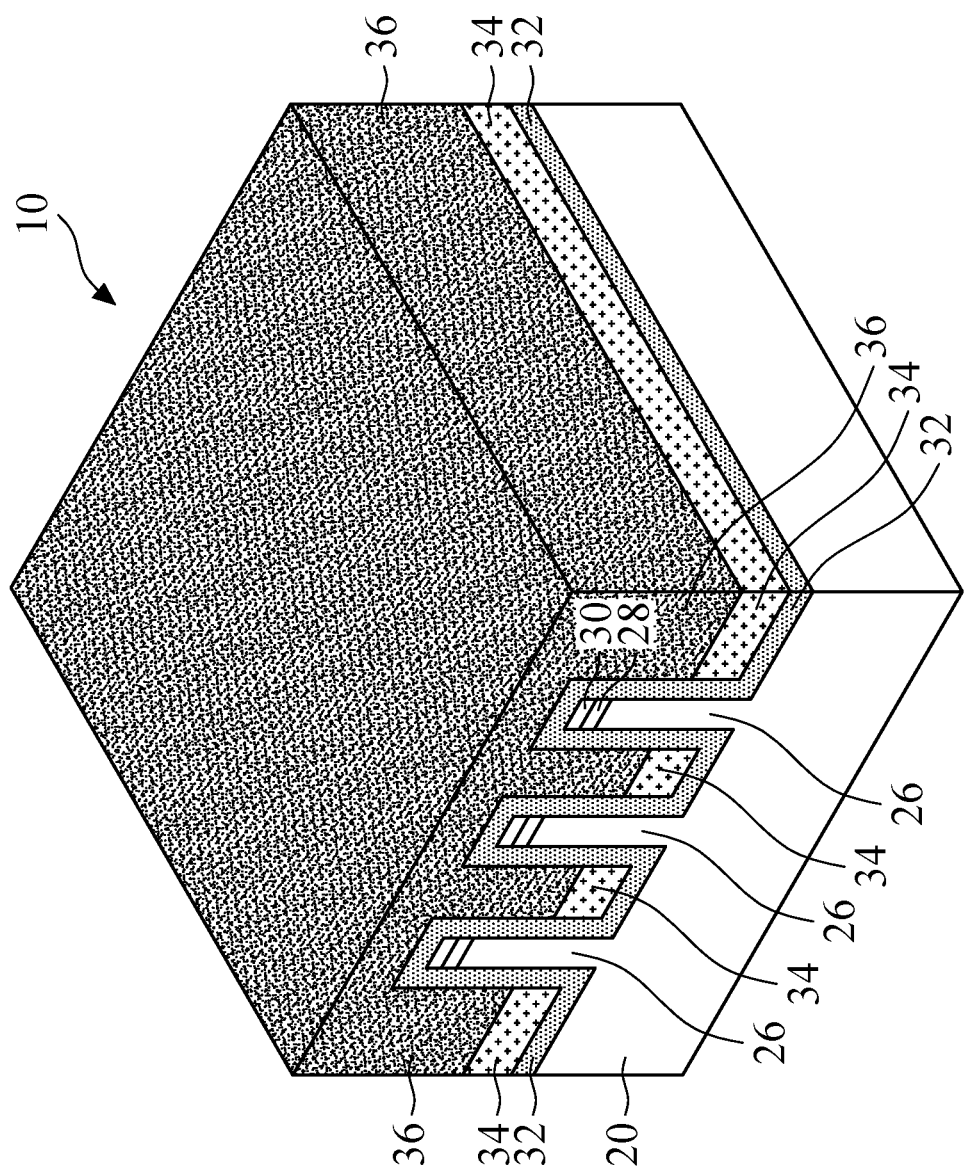

Referring to FIG. 4, dielectric regions 34 are formed. The formation process includes depositing and planarizing a dielectric layer, and etching back the planarized dielectric layer. The respective process is illustrated as process 206 in the process flow 200 shown in FIG. 20. In accordance with some embodiments, (the dielectric layer for forming) dielectric regions 34 may be deposited using Flowable Chemical Vapor Deposition (FCVD), spin-on coating, or the like. In accordance with alternative embodiments, Atomic Layer Deposition (ALD), High-Density Plasma Chemical Vapor Deposition (HDPCVD), CVD, Plasma Enhanced Chemical Vapor Deposition (PECVD) or the like may be used. In accordance with some embodiments, dielectric regions 34 are formed of or comprise silicon nitride, and may be deposited using ALD, CVD, or the like. When FCVD is used, a silicon-and-nitrogen-containing precursor (for example, trisilylamine (TSA) or disilylamine (DSA)) may be used, and hence the resulting dielectric material is flowable. An anneal/curing process is performed, which converts flowable dielectric material into a solid dielectric material.

In a subsequent process, a planarization process such as a Chemical Mechanical Polish (CMP) process or a mechanical grinding process may be performed to planarize the top surface of dielectric regions 34. An etch-back process is then performed to etch back dielectric regions 34 to a desirable height. Accordingly, dielectric regions 34 are recessed.

Further referring to FIG. 4, dielectric layer 36 is deposited over dielectric layer 32 and dielectric regions 34. The respective process is illustrated as process 208 in the process flow 200 shown in FIG. 20. Dielectric layer 36 is formed using a process that has good gap-filling capability. In accordance with some embodiments of the present disclosure, dielectric layer 36 is formed through High-density Plasma Chemical Vapor Deposition (HDPCVD), PECVD, ALD, CVD, or the like. The material of dielectric layer 36 is different from the material of dielectric layer 32, and may be selected from the same (or different) group of candidate materials as that of dielectric layer 32, which candidate materials include, and are not limited to, silicon oxide, silicon nitride, silicon oxynitride, silicon oxy-carbo-nitride, and the like. Dielectric layer 36 may also be formed of a high-k dielectric material such as hafnium oxide, zirconium oxide, aluminum oxide, aluminum nitride, titanium nitride, or the like. Accordingly, dielectric layer 36 may be alternatively referred to as high-k dielectric layer 36. Also, the elements in dielectric layer 36 may be different from the elements in dielectric layer 32, so that in the subsequent process for detecting the end points for etching-back dielectric layer 36, the spectrum of the light beam reflected from dielectric layer 36 is not significantly affected by the spectrum of the light beam reflected from dielectric layer 32. In accordance with some embodiments, dielectric layer 36 fully fills the gap between neighboring protruding portions of dielectric layer 32.

Figure 5:
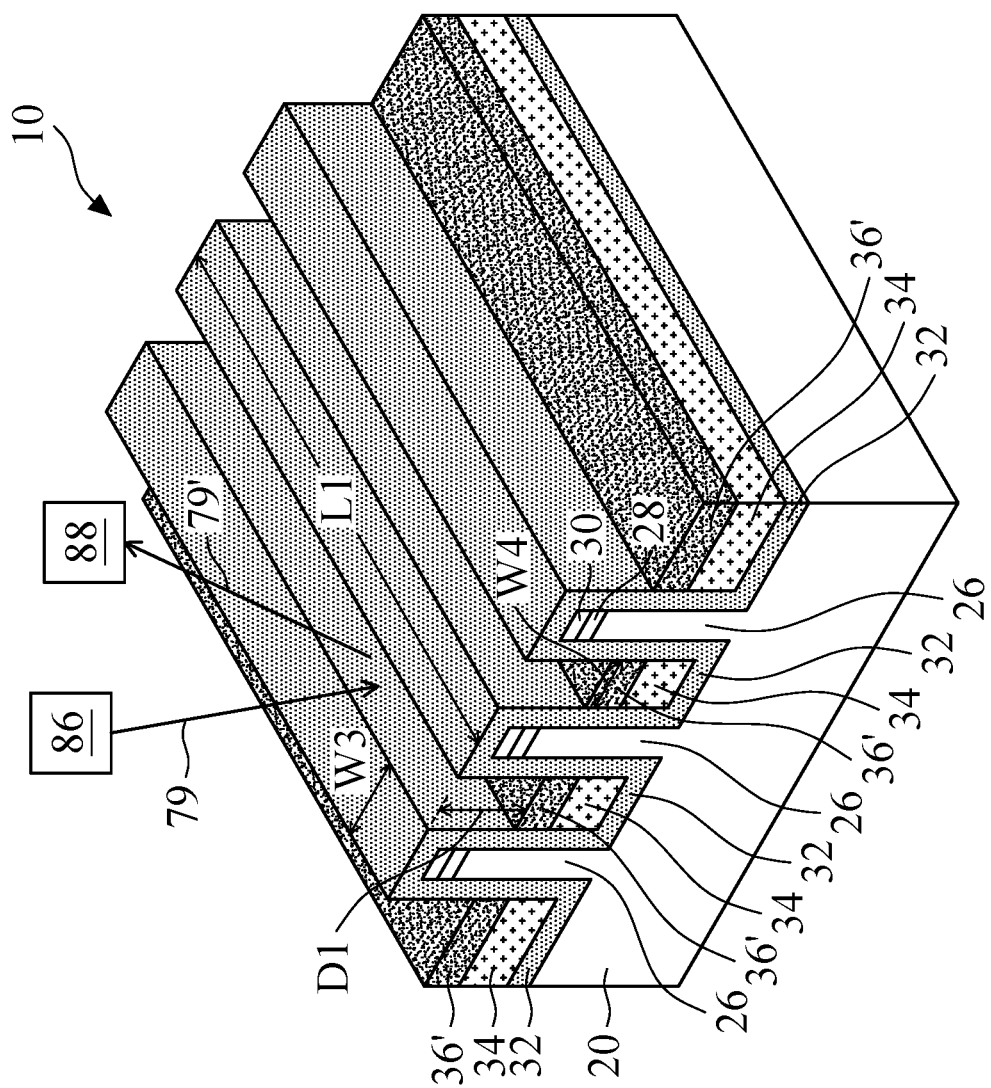
Figure 21:
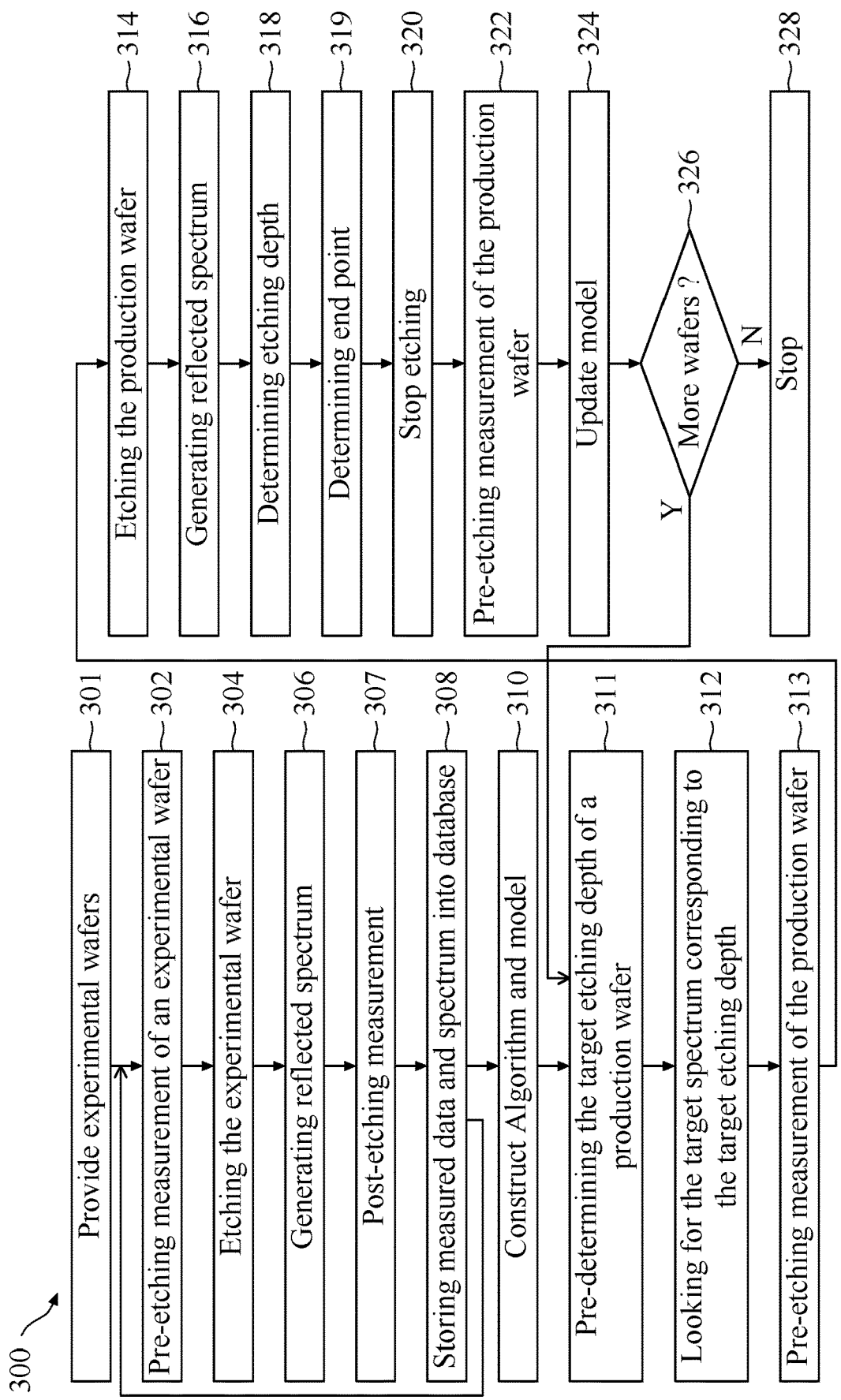
FIG. 21 illustrates a process flow for performing an etching process and determining end points in forming a FinFET in accordance with some embodiments.

A planarization process such as a CMP process or a mechanical grinding process may then be performed to planarize the top surface of dielectric layer 36. Next, as shown in FIG. 5, dielectric layers 36 are etched back, and the remaining portions of dielectric layers 36 are referred to as dielectric regions 36'. As will be discussed in subsequent paragraphs, the etching depth D1 of dielectric regions 36' affect the profile such as the volume and the shape of the subsequently formed epitaxy source/drains, and affect the performance of the resulting FinFETs. Accordingly, in the etch-back process, the depth D1 is controlled to have a desirable value. An end-point determination process is thus provided in accordance with some embodiments to determine depth D1. For example, as briefly illustrated in FIG. 5, a light beam 79 is projected on the surface of wafer 10. The reflected light 79' is collected to generate a spectrum, which is used to determine depth D1, and to determine whether the end point of the etching is reached or not. The details of the end-point determination process are discussed in subsequent paragraphs. The etching process is illustrated as process (flow) 300 in the process flow 200 shown in FIG. 20. The details of the process flow 300 are shown in FIG. 21.

Figure 5A:
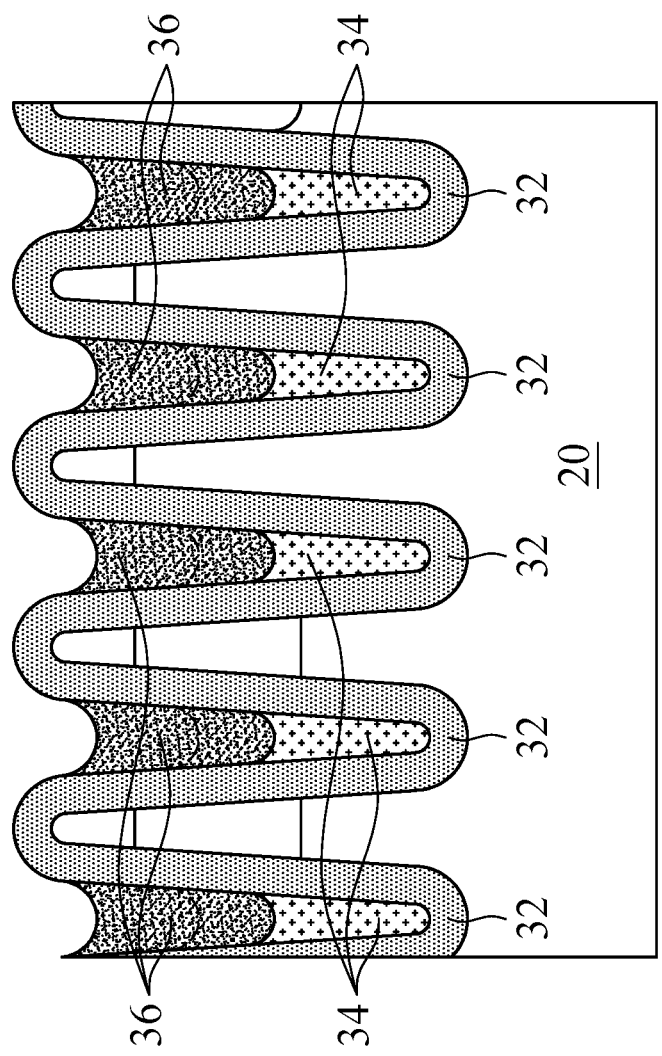
FIG. 5A illustrates a cross-sectional view of a real structure corresponding to FIG. 5, wherein the real structure is formed on a silicon substrate in accordance with some embodiments.

FIG. 5A illustrates a structure obtained from a real sample structure that is formed on a silicon wafer. Dielectric regions 34, 36', dielectric layer 32, semiconductor strips 26 are illustrated. The recessed surfaces of dielectric regions 36' after the etching as discussed referring to FIG. 5 are illustrate using dashed lines.

The etching of dielectric regions 36' may be performed using a dry etching process, wherein etching gases such as $BCl_3$, $Cl_2$, $CF_4$, $CH_4$, $CHF_3$, $O_2$, or the like may be used, depending on the material of dielectric regions 36'. During the etching process, plasma may be generated. Argon may also be included.

Figure 6A:
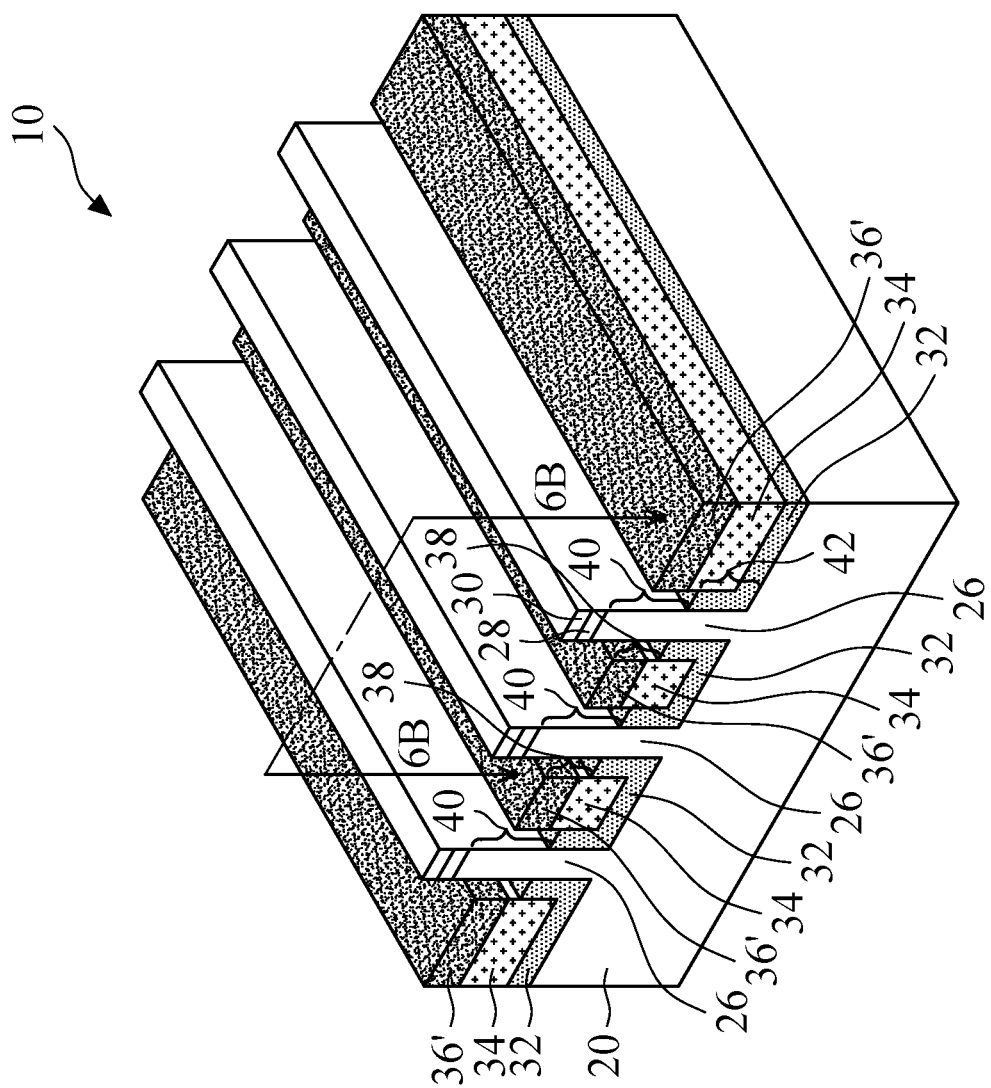
Figure 6B:
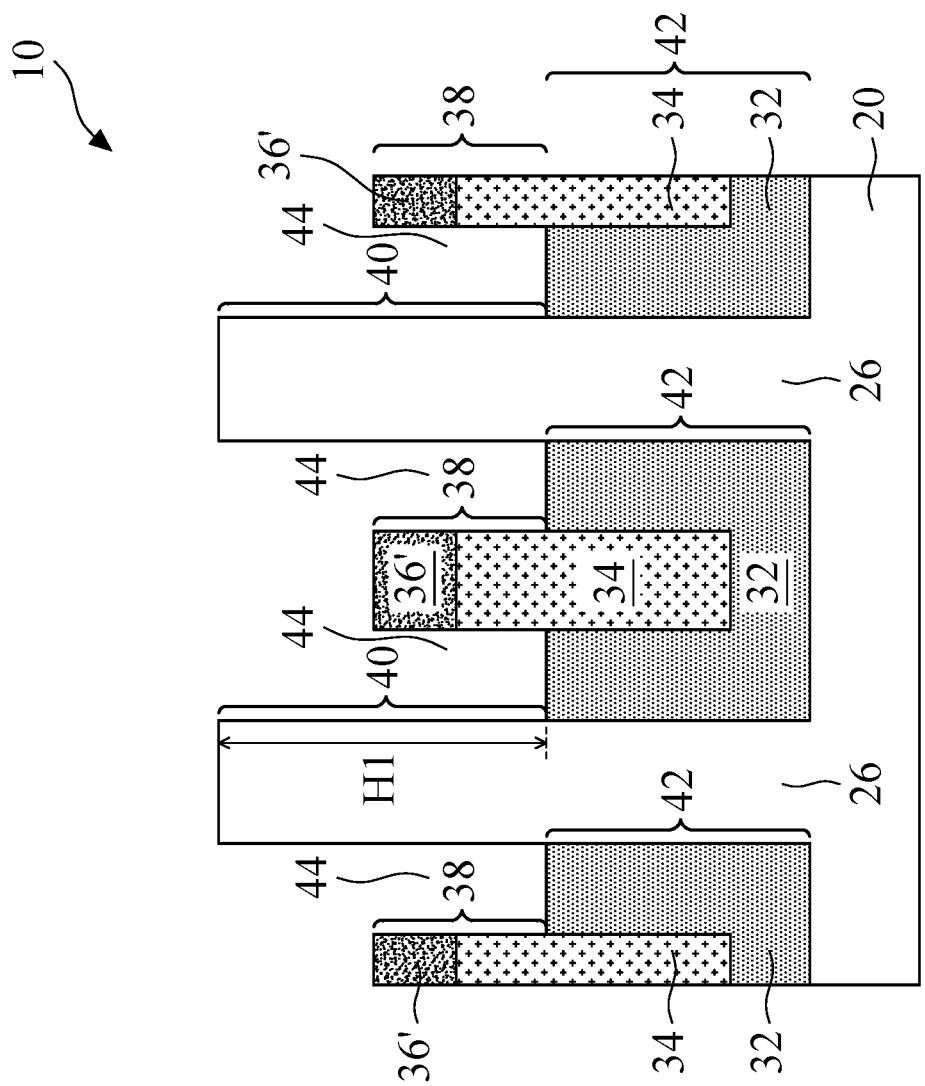

FIGS. 6A and 6B illustrate the recessing of dielectric layer 32. The respective process is illustrated as process 212 in the process flow 200 shown in FIG. 20. The recessing may be performed using an isotropic etching process (such as a wet etching process or a dry etching process) or an anisotropic etching process (such as a dry etching process). The etching chemical (etching solution or etching gas) is selected so that dielectric layer 32 is etched, while dielectric regions 34 and 36' are not etched.

As a result of the recessing of dielectric layer 32, some portions of dielectric regions 36' protrude higher than the top surfaces of the remaining dielectric layer 32 to form dielectric fins 38. Furthermore, semiconductor strips 26 have some top portions protruding higher than the top surfaces of the remaining dielectric layer 32 to form protruding semiconductor fins 40. Throughout the description, the portions of dielectric layer 32, dielectric regions 34, and dielectric regions 36' below protruding semiconductor fins 40 are referred to as Shallow Trench Isolation (STI) regions 42. The interface between dielectric regions 34 and the overlying dielectric regions 36' may be higher than, level with, or lower than the top surfaces of dielectric layer 32. Accordingly, in accordance with some embodiments, dielectric fins 38 include some top portions of dielectric regions 34, as shown in FIGS. 6A and 6B. In accordance with alternative embodiments, dielectric regions 36' may have some bottom portions as parts of STI regions 42.

FIG. 6B illustrates the cross-section 6B-6B in FIG. 6A, wherein the cross-section is obtained in a vertical plane. In the cross-section, dielectric layer 32 has a bottom portion underlying dielectric regions 34 and 36', and sidewall portions over and connected to the opposite ends of the bottom portion. Protruding semiconductor fins 40 and protruding dielectric fins 38 are separated from each other by gaps 44, which are left by the recessed dielectric layer 32. In accordance with some embodiments of the present disclosure, height H1 of protruding semiconductor fins 40 may be in the range between about 35 nm and about 80 nm, while different heights may be adopted.

Figure 7A:
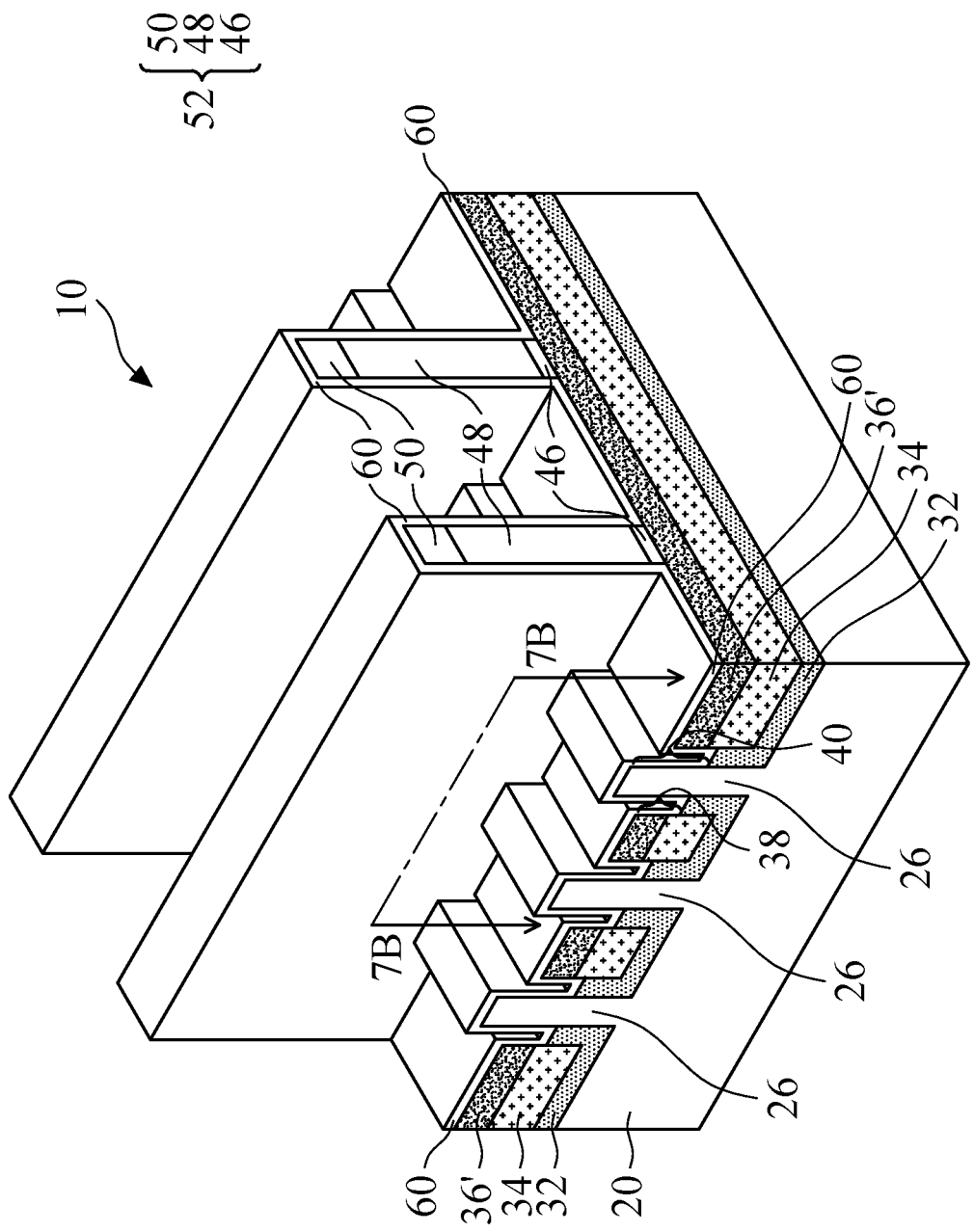

Referring to FIG. 7A, dummy gate stacks 52 are formed to extend on the top surfaces and the sidewalls of protruding semiconductor fins 40 and protruding dielectric fins 38. The respective process is illustrated as process 214 in the process flow 200 shown in FIG. 20. Dummy gate stacks 52 may include dummy gate dielectrics 46 and dummy gate electrodes 48 over dummy gate dielectrics 46. Dummy gate dielectrics 46 may be formed of or comprise silicon oxide, and dummy gate electrodes 48 may be formed of or comprise amorphous silicon or polysilicon, while other applicable materials may also be used. Each of dummy gate stacks 52 may also include one (or a plurality of) hard mask layer 50 over dummy gate electrodes 48. Hard mask layers 50 may be formed of silicon nitride, silicon oxide, silicon carbo-nitride, silicon oxy-carbo-nitride, or multi-layers thereof. Dummy gate stacks 52 may cross over a plurality of protruding semiconductor fins 40 and one or a plurality of protruding dielectric fins 38. Dummy gate stacks 52 also have lengthwise directions perpendicular to the lengthwise directions of protruding semiconductor fins 40 and protruding dielectric fins 38.

The formation of dummy gate stacks 52 may include depositing a conformal gate dielectric layer, depositing a dummy gate electrode layer to fully fill the trenches 44 (FIG. 6B), planarizing the top surface of dummy gate electrode layer, depositing hard mask layers on the planarized dummy gate electrode layer, and patterning the deposited layers.

After the formation of the dummy gate stacks 52, dielectric spacer layer 60 is deposited as a conformal layer. The respective process is illustrated as process 216 in the process flow 200 shown in FIG. 20. In accordance with some embodiments, dielectric spacer layer 60 is formed of or comprises a dielectric material, which may comprise silicon oxide, silicon nitride, silicon oxynitride, silicon oxy-carbo-nitride, or the like, combinations thereof, and/or composite layers thereof.

Figure 7B:
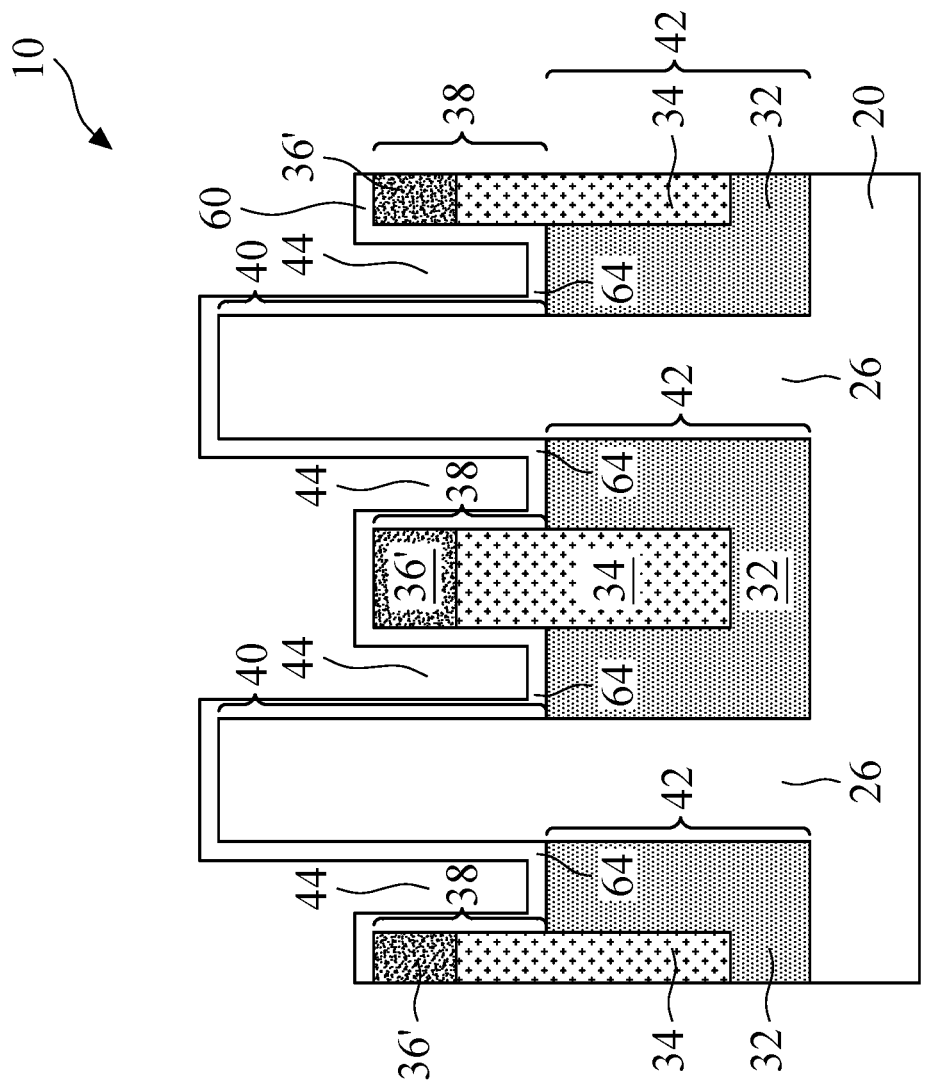

FIG. 7B illustrates the cross-section 7B-7B in FIG. 7A, wherein the cross-section is obtained in a vertical plane. As shown in FIG. 7B, spacer layer 60 may extend into the gaps 44 between protruding semiconductor fins 40 and their corresponding neighboring protruding dielectric fins 38.

Figure 8A:
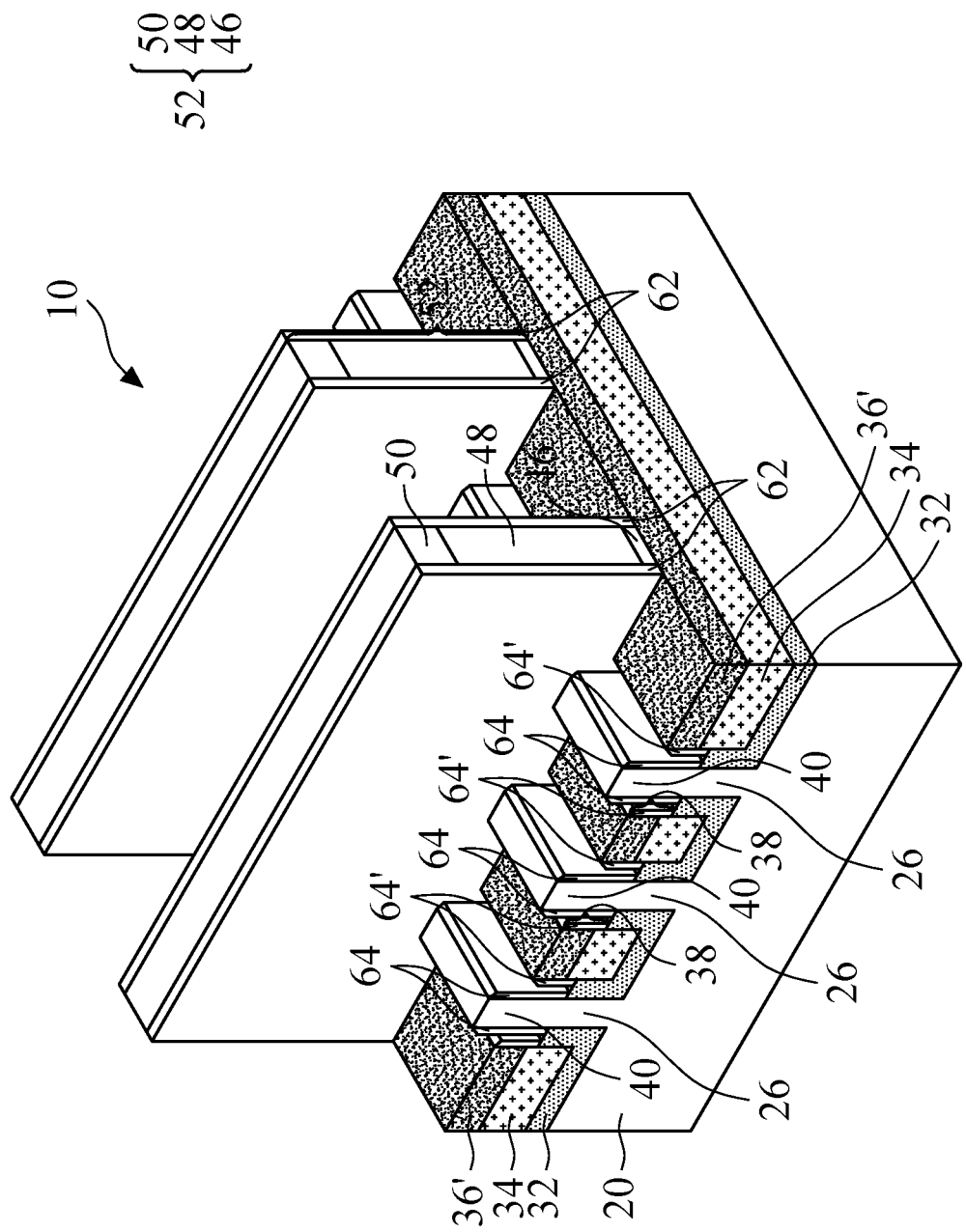
Figure 8B:
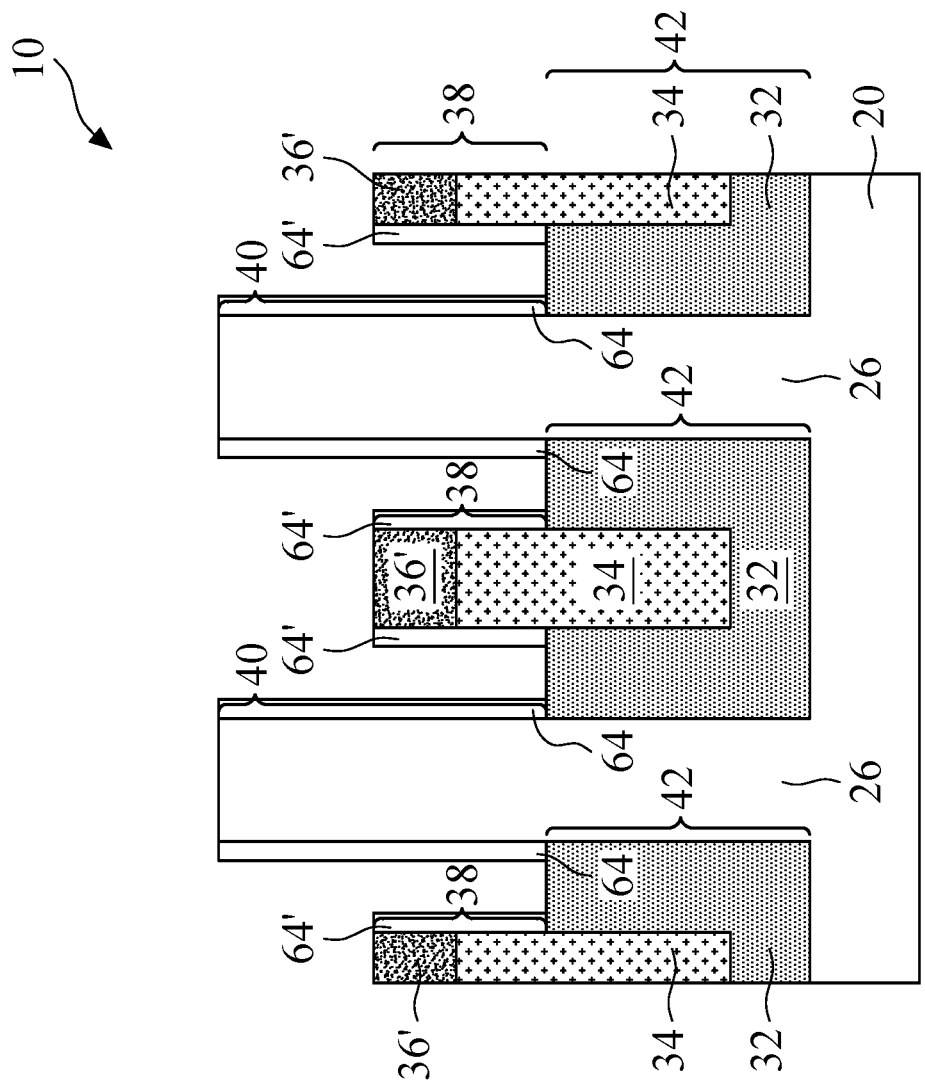

FIGS. 8A and 8B illustrate a perspective view and a cross-sectional view, respectively, in the etching of dielectric spacer layer 60. The etching is performed through one or a plurality of anisotropic etching processes, depending on the structure, the sub-layers, and the materials of dielectric spacer layer 60. As a result of the etching, the top portions of dielectric spacer layer 60 on tops of dummy gate stacks 52, protruding semiconductor fins 40, and protruding dielectric fins 38 are removed. Gate spacers 62 are thus formed on the sidewalls of dummy gate stacks 52, fin spacers 64 are formed on the sidewalls of protruding semiconductor fins 40, and fin spacers 64' are formed on the sidewalls of protruding dielectric fins 38. The respective process is illustrated as process 218 in the process flow 200 shown in FIG. 20. The horizontal portions of the spacer layer 60 contacting the top surfaces of STI regions 42 may be fully removed, or may be thinned, but still have thin portions remaining.

Figure 9:
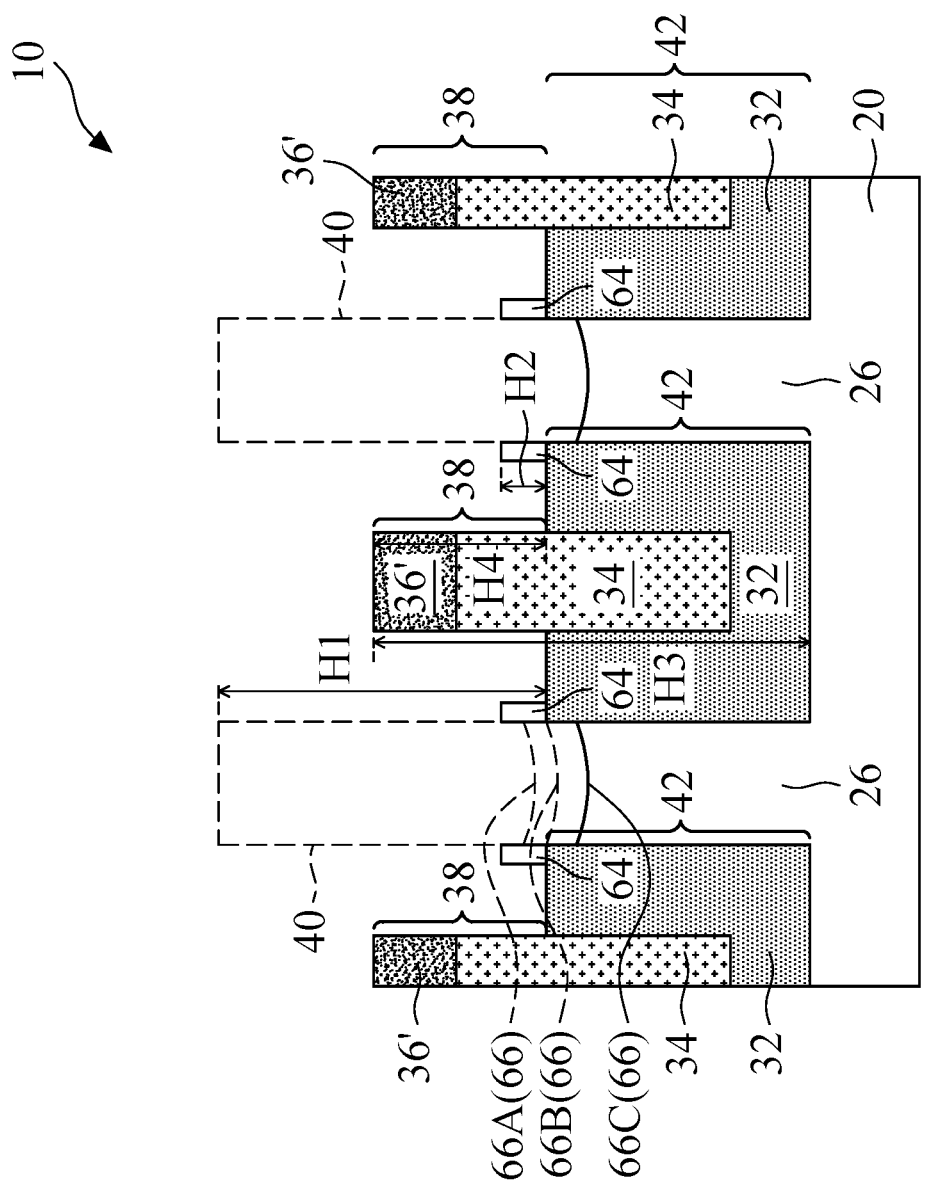

An etching process is then performed to etch the portions of protruding semiconductor fins 40 that are not covered by dummy gate stacks 52 and gate spacer 62 (FIG. 8A), resulting in the recess as shown in FIG. 9. The respective process is illustrated as process 220 in the process flow 200 shown in FIG. 20. FIG. 9 illustrates the cross-section same as the cross-section of FIG. 8B. In FIG. 9, dashed lines are used to represent the portions of protruding semiconductor fins 40 that are protected by dummy gate stacks 52 and gate spacers 62. The protruding semiconductor fins 40 are not in the illustrated plane, and hence are shown as dashed.

The recessing may be anisotropic, and hence the portions of protruding semiconductor fins 40 directly underlying dummy gate stacks 52 and gate spacers 62 are protected from being etched. The top surfaces of the recessed semiconductor fins 40 (or semiconductor strips 26) may be high than, level with, or lower than the top surfaces of STI regions 42. For example, dashed lines 66A and 66B and solid top surface 66C illustrate the possible positions of the top surfaces 66 of the remaining protruding semiconductor fins 40 (or semiconductor strips 26). In accordance with some embodiments of the present disclosure, the recessing of protruding fins 40 is performed through a dry etching process. The dry etching may be performed using process gases such as $C_2F_6$, $CF_4$, $SO_2$, the mixture of HF and ozone (followed by diluted HF), the mixture of HBr, $Cl_2$, and $O_2$, the mixture of HBr, $Cl_2$, $O_2$, and $CF_2$, or the like. The etching may be anisotropic.

In the recessing process, gate spacers 62, fin spacers 64, and fin spacers 64' are also recessed. In accordance with some embodiments, the fin spacers 64' are fully removed, or substantially fully removed, since fin spacers 64' have a smaller height than fin spacers 64 and gate spacers 62. In accordance with alternative embodiments, there may also be small portions of fin spacers 64' remaining. The majority of gate spacers 62 (FIG. 8A) remain after the recessing process. The fin spacers 64 on protruding semiconductor fins 40 still have some portions remaining. The heights H2 of the remaining fin spacers 64 is related to the height H4 of protruding fins 38, and the greater the height H4 is, the greater the height H2 of the remaining fin spacers 64' will be, and vice versa. Furthermore, the greater the height H2 is, the less protruding semiconductor fins 40 are recessed, and the higher the top surface 66 will be, and vice versa. The height of the entire dielectric region layer/regions 32/34/36' is denoted as height H3.

Figure 10A:
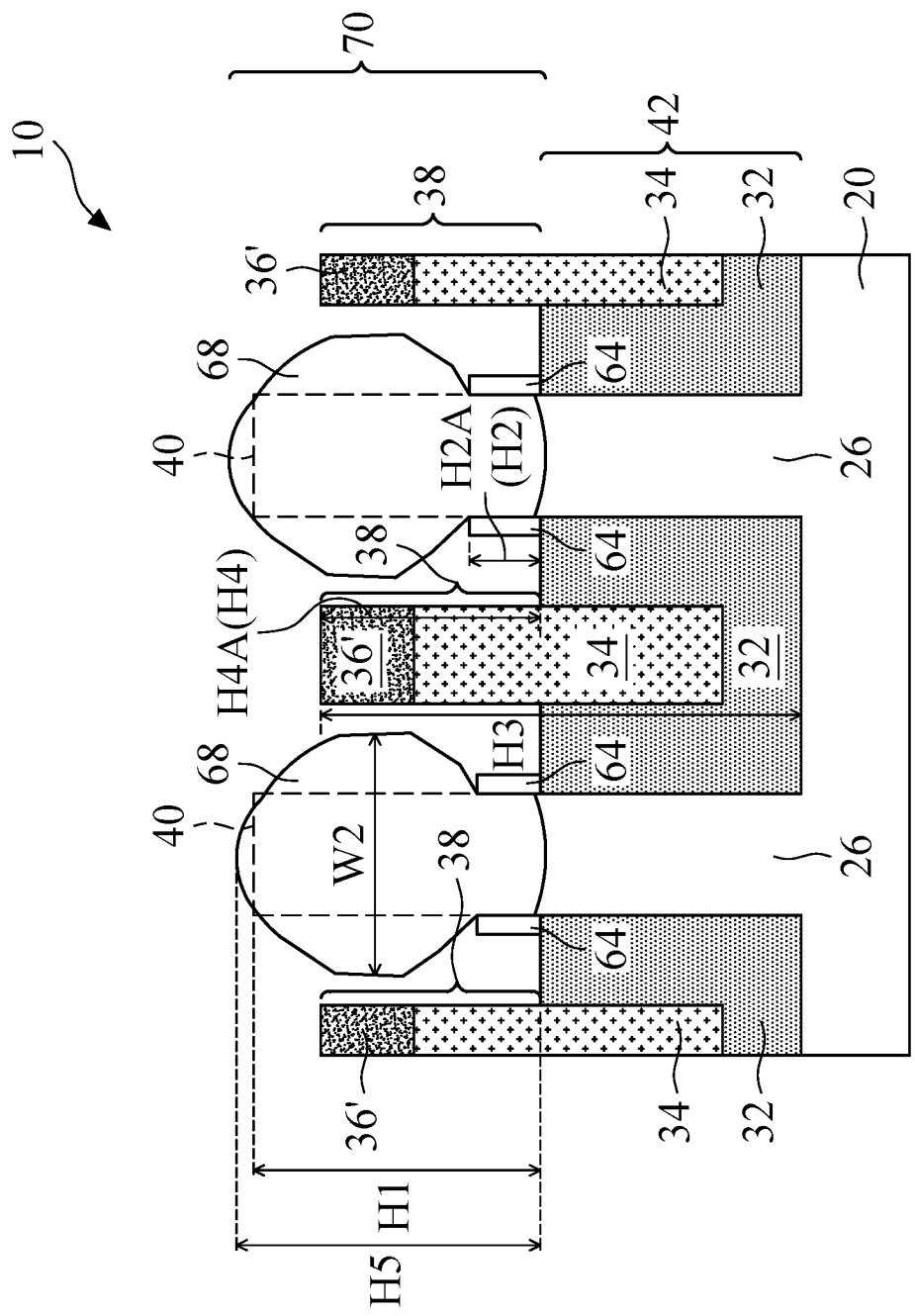
Figure 10B:
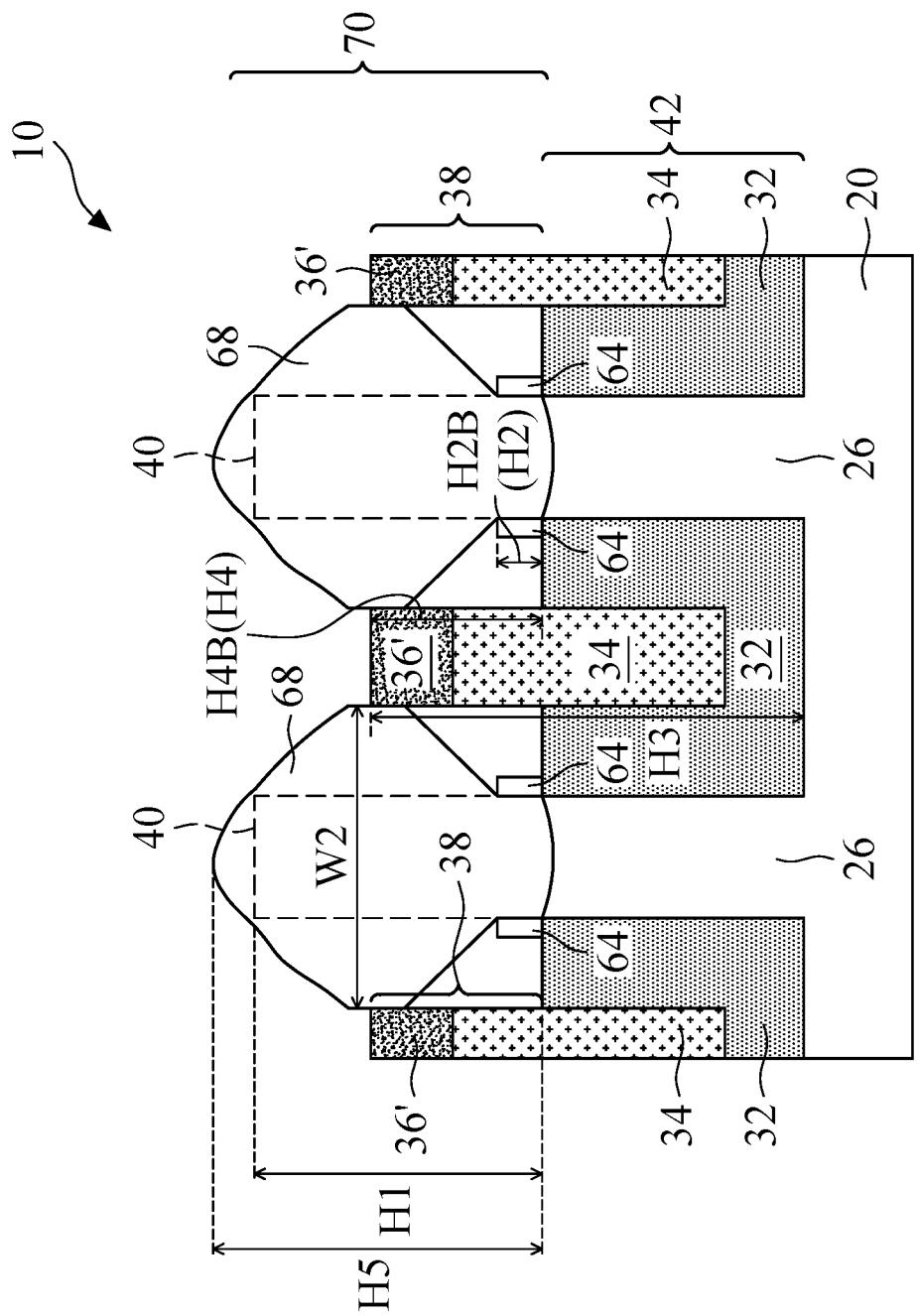
Figure 10C:
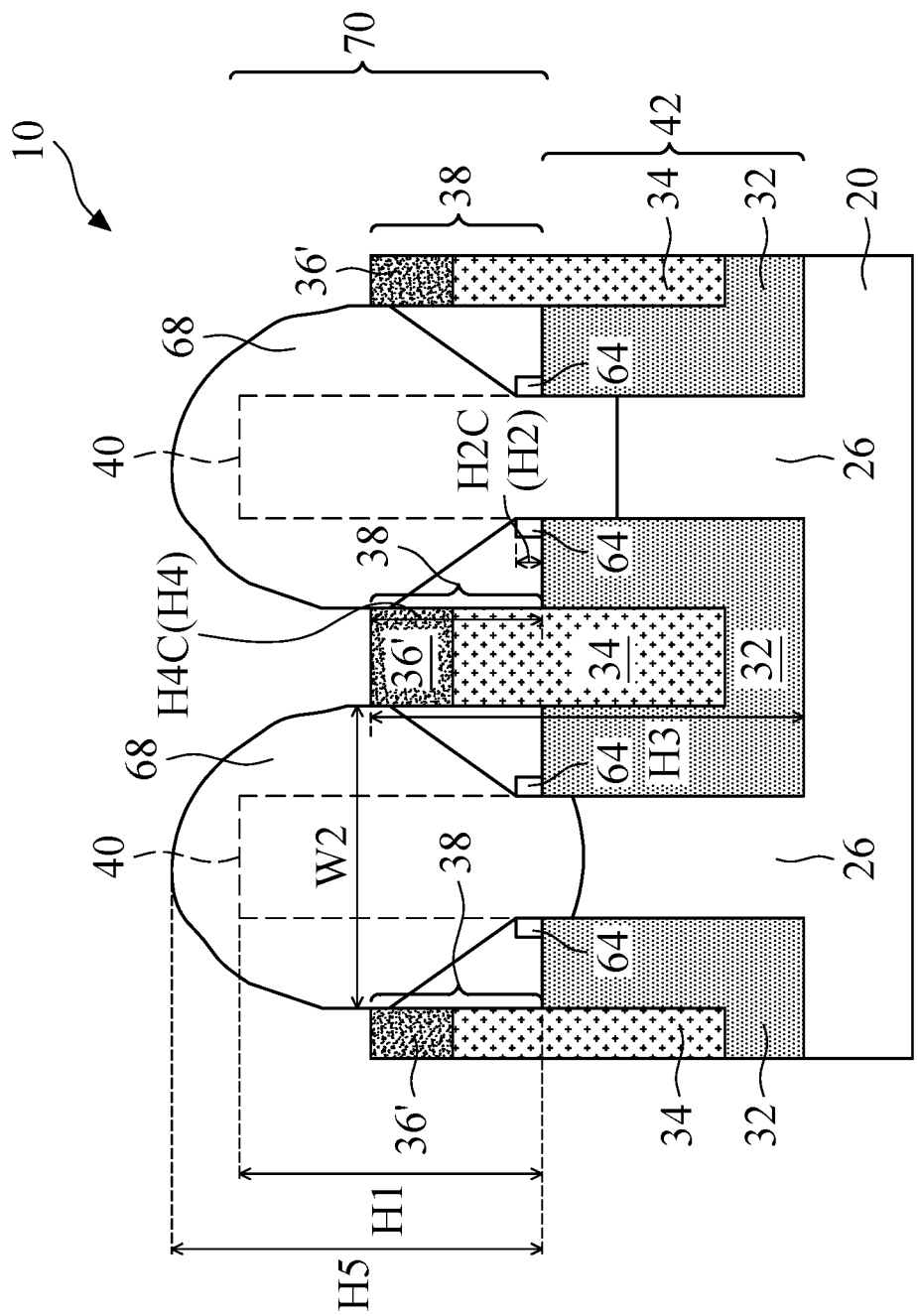

Next, epitaxy regions (source/drain regions) 68 are formed by selectively growing (through epitaxy) a semiconductor material in the recesses, resulting in the structure in FIG. 10A, 10B, or 10C. The respective process is illustrated as process 222 in the process flow 200 shown in FIG. 20. Depending on whether the resulting FinFET is a p-type FinFET or an n-type FinFET, a p-type or an n-type impurity may be in-situ doped with the proceeding of the epitaxy. For example, when the resulting FinFET is a p-type FinFET, silicon germanium boron (SiGeB), silicon boron (SiB), or the like may be grown. Conversely, when the resulting FinFET is an n-type FinFET, silicon phosphorous (SiP), silicon carbon phosphorous (SiCP), or the like may be grown. In the epitaxy process, protruding dielectric fins 38 are used to limit the lateral growth of epitaxy source/drain regions 68, and prevent neighboring source/drain regions 68 from merging with each other.

FIGS. 10A, 10B, and 10C illustrate three possible profiles of epitaxy regions 68. It is appreciated that the profiles of epitaxy regions 68 in these figures are illustrated schematically, and the actual profiles may be different. For example, the p-type and n-type epitaxy regions 68 may have different shapes. The height H4A of protruding dielectric fins 38 in FIG. 10A is greater than the height H4B of protruding dielectric fins 38 in FIG. 10B, which is further greater than the height H4C of protruding dielectric fins 38 in FIG. 10C. Similarly, the height H2A of fin spacers 64 in FIG. 10A is greater than the height H2B of fin spacers 64 in FIG. 10B, which is further greater than the height H2C of fin spacers 64 in FIG. 10C. The volume of the resulting epitaxy regions 68 in FIG. 10A is thus smaller than the volume of the resulting epitaxy regions 68 in FIG. 10B, which is further smaller than the volume of the resulting epitaxy regions 68 in FIG. 10C.

It is appreciated that epitaxy regions 68 cannot be too small or too big in volume. When epitaxy regions 68 are too small, the speed of the resulting FinFETs is degraded due to reduced number of electrons or holes. When epitaxy regions 68 are too large, in subsequent planarization process, some top portions of epitaxy regions 68 may be removed in polishing processes, again degrading the performance of the resulting FinFETs. Also, the shapes of the top surfaces of epitaxy regions 68 in FIGS. 10A, 10B, and 10C may be different from each other.

Some sample results are obtained from sample wafers, and are discussed herein to prove the relationship between protruding dielectric fins 38 and the profile of the resulting epitaxy region. For example, in FIGS. 10A, 10B, and 10C, H1 is the height of protruding fins 40, H2 is the height of fin spacers 64, H3 is the height of the hybrid fin including dielectric regions/layers 32/34/36', and H4 is the height of protruding fins 38. H5 is the height of epitaxy regions 68 measured from the top of epitaxy regions 68 to the bottoms of the corresponding fin spacers 64. W2 is the maximum width of the epitaxy regions 68.

In accordance with some embodiments, the ratio H2/H1 in FIG. 10C is in the range between about 0.13 and about 0.144. The ratio H2/H1 in FIG. 10B is in the range between about 0.144 and about 0.156. The ratio H2/H1 in FIG. 10A is in the range between about 0.156 and about 0.17. Accordingly, from FIG. 10A to FIG. 10B, and then to FIG. 10C, ratios H2/H1 become increasingly smaller. The ratio H3/H1 in FIG. 10C is in the range between about 1.6 and about 1.75. The ratio H3/H1 in FIG. 10B is in the range between about 1.75 and about 1.85. The ratio H3/H1 in FIG. 10A is in the range between about 1.85 and about 2.

Due to the increasingly smaller ratios H2/H1, both of the width W2 and height H5 of epitaxy regions 68 in FIGS. 10A, 10B, and 10C are increasingly greater, resulting in increasingly greater volume. For example, when epitaxy regions 68 are n-type regions, the width W2 in FIGS. 10A, 10B, and 10C are 35.27 nm, 36.56 nm, and 37.5 nm, respectively. The Height H5 in FIGS. 10A, 10B, and 10C are 50.24 nm, 51.38 nm, and 53.4 nm, respectively. When epitaxy regions 68 are p-type regions, the width W2 in FIGS. 10A, 10B, and 10C are 33.5 nm, 35.1 nm, and 37.2 nm, respectively. The Height H5 in FIGS. 10A, 10B, and 10C are 35.8 nm, 40.8 nm, and 44.7 nm, respectively.

In subsequent processes, Contact Etch Stop Layer (CESL, not shown) and Inter-Layer Dielectric (ILD, not shown) may be formed on top of epitaxy regions 68 and surrounding dummy gate stacks 52 and gate spacers 62. Next, the dummy gate stacks 52 as shown in FIG. 8A are replaced with replacement gate stacks. Gate contact plugs, source/drain silicide regions, and source/drain contact plugs are also formed to finish the formation of the FinFETs 70, with the source/drain regions, which are epitaxy regions 68, of the FinFETs 70 shown in FIGS. 10A, 10B, and 10C.

As presented above, the etching depth D1 of dielectric regions 36' as shown in FIG. 5 affects the height H4 (FIGS. 10A, 10B, and 10C) of protruding dielectric fins 38, which further affects the volume of epitaxy regions 68. In accordance with some embodiments of the present disclosure, a process for determining the end point for etching dielectric regions 36' is provided to control the height of protruding dielectric fins 38, and accordingly control the profile (such as the volume and the shape) of epitaxy regions 68.

Figure 11:
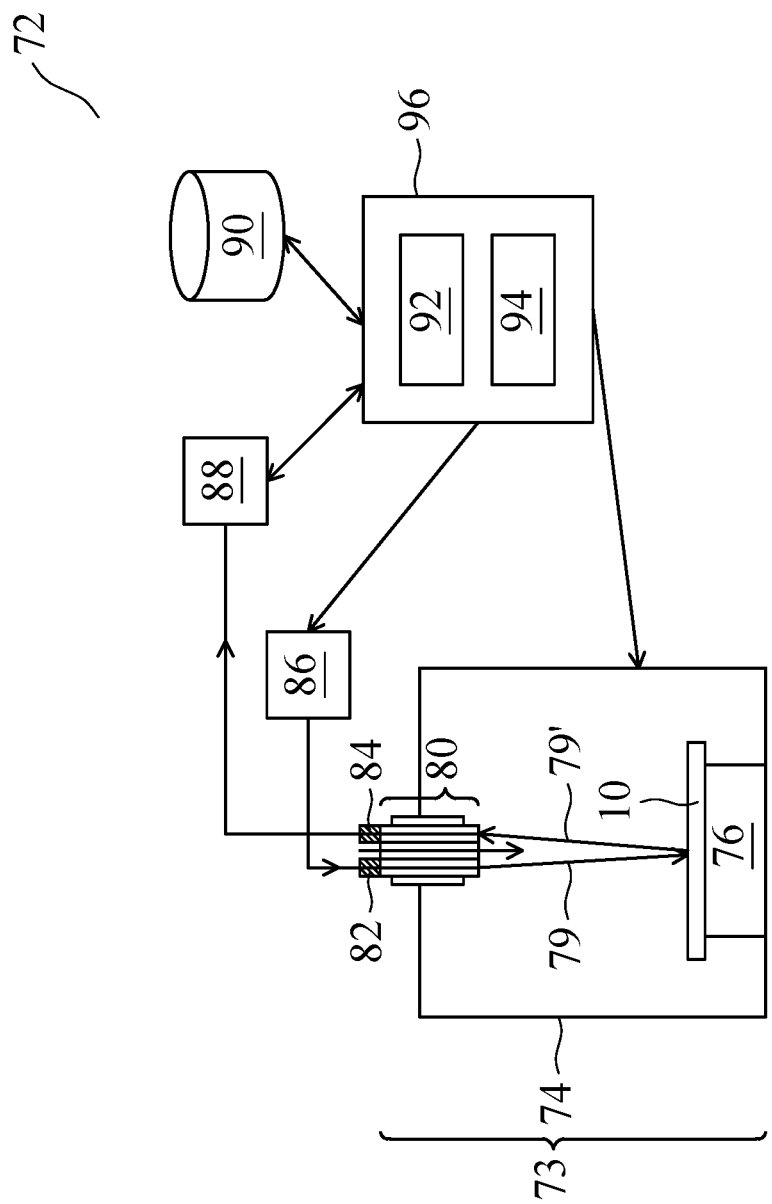
FIG. 11 illustrates an apparatus for etching a dielectric fin and detecting end point in real-time in accordance with some embodiments.

FIG. 11 illustrates etching system 72, which may be used for etching dielectric regions 36' (FIG. 5), with the end point of the etching process being determined in real-time by using reflected spectrum from the wafer. It is appreciated that although the determination of the end point in the etching of dielectric regions 36' is used as an example, the real-time determination may also be used in the etching or selective growth of other features including, and not limited to, semiconductor regions, metallic regions, or the like.

Etching system 72 includes etcher 73, which includes vacuum chamber 74. Chuck 76 is located in vacuum chamber 74 for securing wafer 10 thereon. Wafer 10 includes the regions to be etched. For example, wafer 10 may have the structure as shown in FIG. 5, while other types of wafers may also be used. View port 80 is at the top of chamber 74. The etcher 73 may be a plasma etcher, which may be a Transformer Coupled Plasma (TCP) etcher or an Inductively Coupled Plasma (ICP) etcher. In accordance with some embodiments, there include an inlet and an outlet (not shown) for the etching gas to be conducted into or out of chamber 74. A light-projecting device 82 and a light-receiving device 84 may be placed next to viewing port 80. In accordance with some embodiments, the light-projecting device 82 comprises a part of an optical fiber for conducting a light beam as an example. The light-receiving device 84 may include a light-focusing device and a part of an optical fiber as an example.

Figure 13:
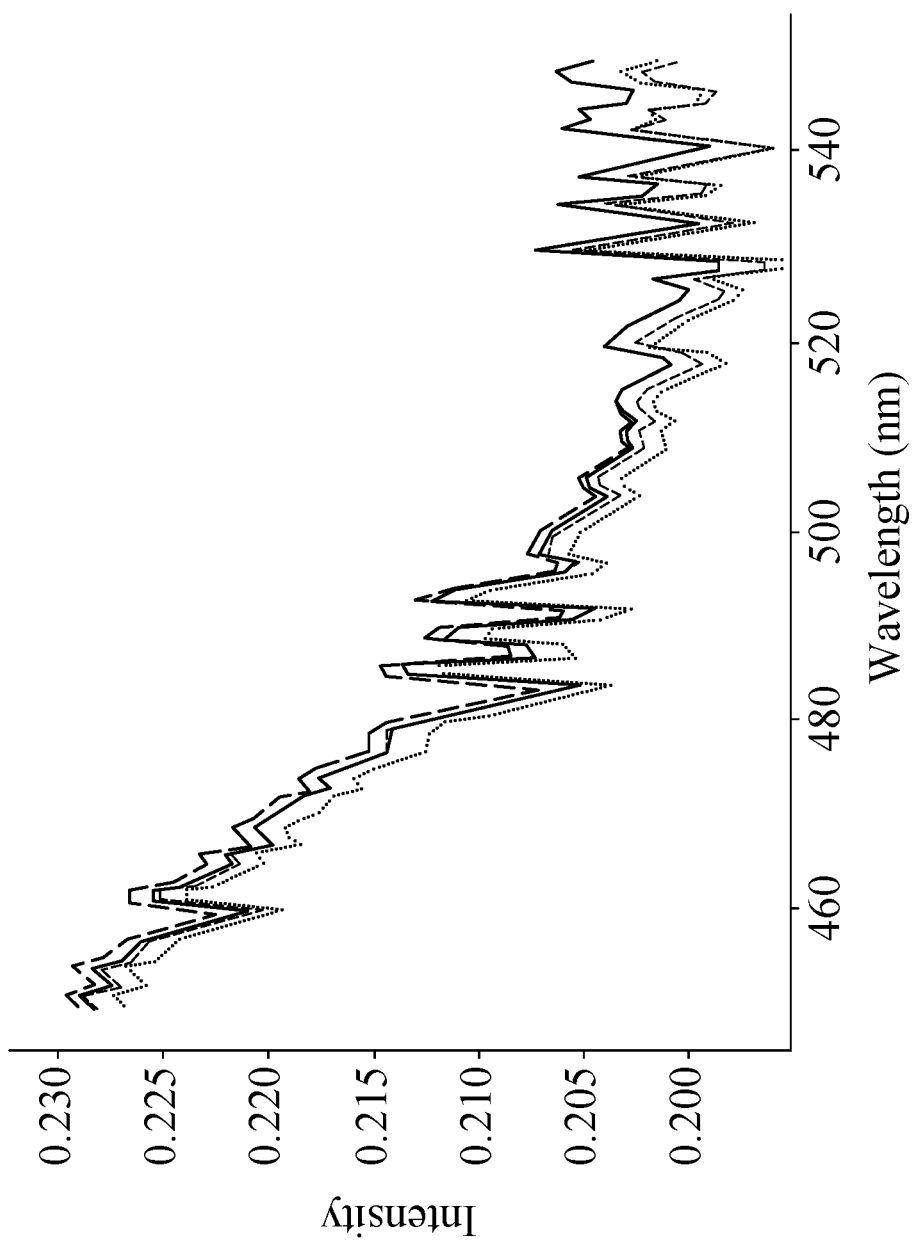
FIG. 13 illustrates the reflected spectrums from the etched dielectric fins in accordance with some embodiments.

The system 72 further includes light source 86 for generating a light beam, and a spectrometer 88 for generating spectrum from the light reflected from wafer 10. The light-projecting device 82 projects light beam 79, which is generated by light source 86, onto wafer 10, and reflected light 79' is received by light-receiving device 84, which sends the reflected light 79' to spectrometer 88. The light beam generated by the light source 86 may include a wide range of spectrum. For example, the light beam may include the light with wavelength spread throughout the range between about 300 nm and about 600 nm. This range of the wavelength may cover the characteristic wavelength values that may be used by the embodiments of the present invention, so that the characteristic peaks and valleys of interest are within the range, and the change in the signal intensity of the characteristic peaks and valleys may be used for determining the depths of dielectric regions 36'. Furthermore, the light energy is substantially evenly distributed to the whole range. In an example, the light source 86 may generate a white light. Spectrometer 88 receives the reflected light from light-receiving device 84, and generates the spectrum, which is also referred to as reflected spectrum hereinafter. For example, FIG. 13 illustrates some example spectrums, wherein the intensity of the light is illustrated as a function of the wavelength.

Referring back to FIG. 11, etching system 72 includes database 90, which is configured to store the data obtained in the etching of wafers. For example, regarding the example wafer 10 as shown in FIG. 5, database 90 may save the geometric information such as the width W4 (Critical dimension (CD), also referred to as optical CD (OCD) due the measurement using optical means), the length L1, and the depth D1 of dielectric regions 36'. Since different materials have different spectrums, when the materials (and their combination) that receive light beam 79 are changed, the spectrum also changes. The specific material (such as a high-k material of dielectric regions 36') may also be stored in database 90. Accordingly, spectrum may be associated with the material(s), and when the materials of dielectric regions 36' and dielectric layer 32 are changed, different spectrum may be obtained and stored the stored database 90. Database 90 may also store the environmental information of the etched regions. For example, database 90 may save the widths, lengths, and the material of dielectric layer 32, which are exposed and also reflect light. In addition, database 90 also saves the spectrums obtained from the wafers, as will be discussed in subsequent paragraphs. The spectrums are correlated to the information of the wafers as aforementioned. For example, the spectrums may be indexed to the materials and the depth D1 of the dielectric regions 36', so that the spectrums may be found through searching using this information. The etching depth D1 may also be searched using spectrum, for example, by search the characteristic parameters (discussed in subsequent paragraphs) of spectrums. Accordingly, when a spectrum is generated from a reflected light, the corresponding etching depth D1 may be found by search database 90.

Etching system 72 further includes control unit 96, which is configured to control the etching process and to operate database 90. Control unit 96 may include model center 92, which stores a machine-learning algorithm, which may build and improve a model (stored in the model center) using data obtained from the previously etched and measured wafers. The algorithm is applied to the future etching of wafers. Also, control unit 96 includes a computing unit 94, which executes the algorithm, and communicates with database 90, light source 86, and spectrometer 88. An example etching process is briefly discussed below, and more details are also discussed in subsequent paragraphs.

In the beginning of an etching process, a target etching depth of dielectric regions 36' is predetermined. In the etching process, computing unit 94 may control etcher 73 to start the etching process, control light source 86 to emit light beam 79, which is projected on wafer 10. Computing unit 94 further controls light-receiving device 84 to generate a spectrum from the reflected light, and stores the spectrum to database 90. Computing unit 94 receives spectrums from spectrometer 88. Also, computing unit 94 compares the spectrums received from the spectrometer 88 with the stored spectrums (in database 90) of similar wafers, so that the existing etching depth D1 (FIG. 5) is determined. Computing unit 94 may also compute how much more dielectric regions are to be etched and the expected etching time, which corresponds to the end point of the etching process. Throughout the etching process, the spectrum is generated repeatedly and in real-time, so that the etching depth is determined in real-time, and in real-time, until the target etching depth is reached.

Reaching the target etching depth also means the end point of the etching process is reached. Computing unit 94 thus controls etcher 73 to stop the etching. Once the etching of the current wafer is finished, the etched wafer is measured using metrology tools, for example, to determine the actual etching depth. Computing unit 94 compares the actual (measured) etching depth with the pre-determined target etching depth, which is also the etching depth determined through the reflected spectrums. If the actual etching depth does not match the target etching depth, computing unit 94 updates the algorithm and the model, and stores the updated algorithm and model into the model center 92. A subsequent wafer may then be etched, which etching process is performed using the updated algorithm and model.

Figure 12A:
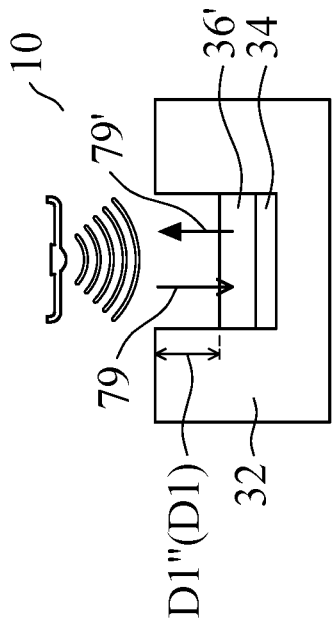
FIGS. 12A, 12B, and 12C schematically illustrate the detection of end point in the etching of a dielectric fin in accordance with some embodiments.
Figure 12B:
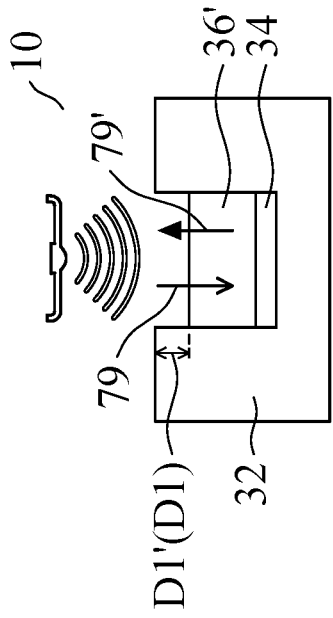
Figure 12C:
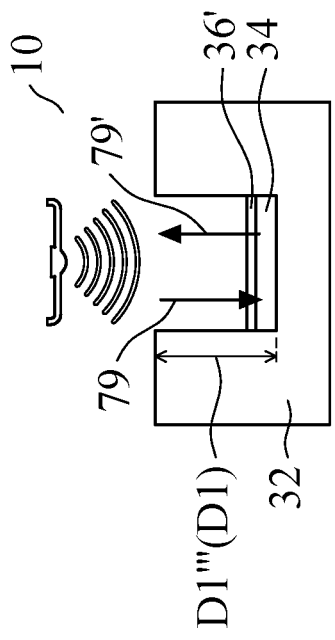
Figure 14:
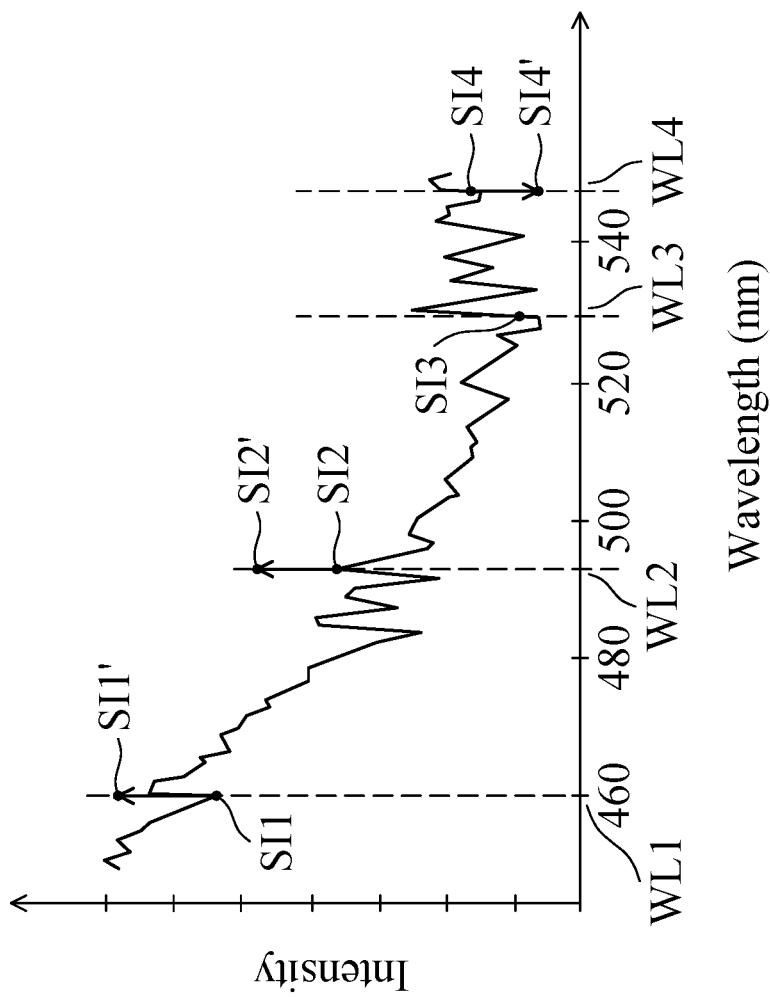
FIG. 14 illustrates a spectrum from an etched dielectric fin in accordance with some embodiments.
Figure 15:
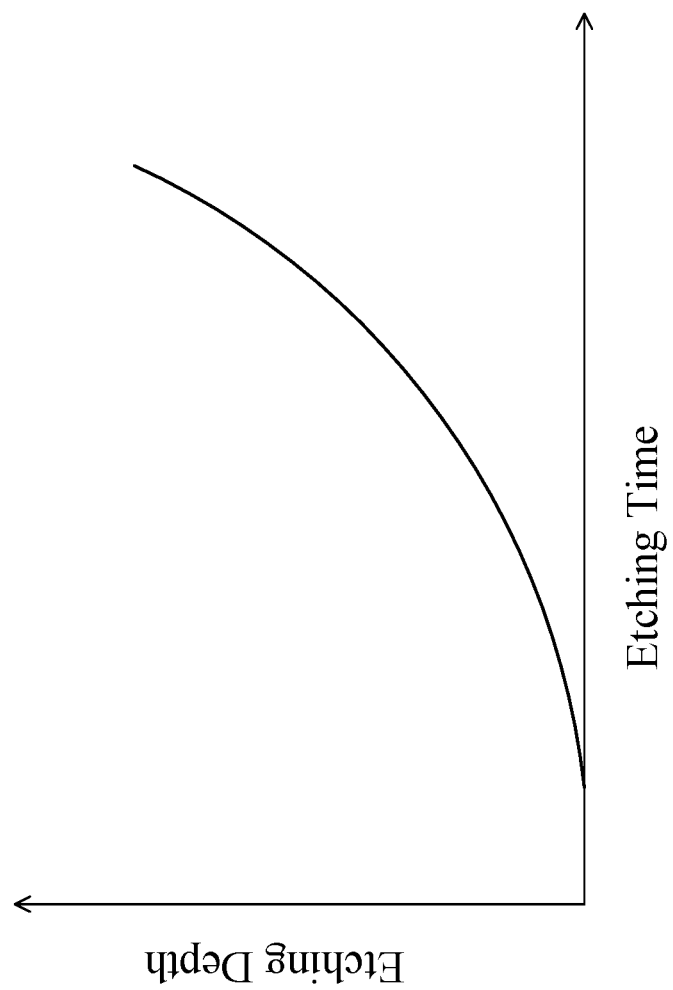
FIG. 15 illustrates the depth of the etched dielectric fin as a function of etching time in accordance with some embodiments.

An example of using the stored spectrums and other information combined with the currently measured spectrums is discussed referring to FIGS. 12A, 12B, 12C, and 13-15. FIGS. 12A, 12B, and 12C illustrate the intermediate stages in the etching of dielectric regions 36' in wafer 10. The illustrated portions may be found in FIG. 5. FIGS. 12A, 12B, 12C illustrate a sequence of etching processes, wherein with the proceeding of time, the depth D1' in FIG. 12A increases to depth D1" in FIG. 12B, and then increases to depth D1''' in FIG. 12C. FIG. 15 illustrates the correlation of the etching depth D1 as a function of etching time.

At a first time point corresponding to FIG. 12A, light beam 79 is projected on wafer 10, and the reflected light is collected and sent to spectrometer 88 (FIG. 11). A first spectrum is thus generated. Similarly, at a second time point corresponding to FIG. 12B, a second spectrum is generated. Since the depth D1" is different from depth Dr, the spectrum obtained at the second etching time is different from the first spectrum. At a third time point corresponding to FIG. 12C, a third spectrum is generated. Since the depth D1''' is different from depths D1' and D1", the spectrum obtained at the third time point is different from the first spectrum and the second spectrum. Accordingly, for a selected combination of structure and material, the etching depth may correspond to spectrums with a one-to-one correspondence.

FIG. 13 illustrates some spectrums obtained at different time points. These spectrums obtained from the wafers having the similar structures and similar materials. Comparing different spectrums, the signal intensity values at the same wavelength are different from each other. The signal intensity values thus may be used for determining the current etching depth D1 (FIGS. 12A, 12B, and 12C), and determine the end point of the etching. An example end point determination process is discussed referring to FIG. 14. It is appreciated that the discussed end point determination process is merely an example, and there may be alternative ways, which are also in the scope of the present disclosure.

FIG. 14 illustrates a first spectrum obtained at a first time point (for example, FIG. 12A) corresponding to a first etching depth. For example, the time point may be the beginning of the etching process, wherein the first etching depth may be 0 or another non-zero value. A plurality of characteristic wavelengths WL1, WL2, WL3, and WL4 are selected. The characteristic wavelengths WL1, WL2, WL3, and WL4 may be selected as the wavelengths whose corresponding signal intensity changes most significantly when the etching depth increase. Some of characteristic wavelengths may also be selected as the wavelengths whose corresponding signal intensity change least significantly when the etching depth increase. For example, when the etching depth increases, the signal intensity at wavelengths WL1, WL2, and WL4 have the most significant changing magnitude, while the signal intensity at wavelength WL3 is substantially unchanged. In accordance with some embodiments, the signal intensity at characteristic wavelengths WL1, WL2, WL3, and WL4 are SI1, SI2, SI3, and SI4, respectively. Accordingly, the collection of signal intensity values SI1, SI2, SI3, and SI4 and their ratios such as SI1/SI3, SI2/SI3, SI4/SI3, SI1/SI4, etc., may be used as characteristic parameters that may be used to uniquely identify the corresponding spectrum and to identify the corresponding first etching depth (for example, 0 in an example). In the database 90 as shown in FIG. 11, the spectrum, the characteristic parameters, and the corresponding first etching depth may be stored and indexed to each other.

When the etching depth increases to a second etching depth (for example, depth D1" in FIG. 12B), a second spectrum may be generated, and the signal intensity values are changed compared to the first spectrum. FIG. 14 illustrates some arrows, which represent that when the etching depth increases, the changing direction of the signal intensity values at the corresponding wavelengths. For example, at wavelengths WL1 and WL2, the signal intensity increase to new values SI1' and SI2', respectively. At wavelength WL3, the signal intensity is unchanged and remains to be SI3. At wavelength WL4, the signal intensity is reduced to SI4'. Accordingly, the collection of signal intensity values SI1', SI2', SI3, and SI4' and their ratios such as SI1/SI3, SI2'/SI3, SI4'/SI3, SI1'/SI4', etc., may be used as characteristic parameters to uniquely identify the corresponding second etching depth. In accordance with some embodiments, the second spectrum, the characteristic parameters corresponding to the second spectrum, and the corresponding second etching depth are stored in the database 90.

With the etching depth increases, the changing of the signal intensity values has certain trend. For example, the signal intensity values on the left side (with smaller wavelength values) of characteristic wavelength WL3 may increase initially. When the etching depth is increased to a certain value, with the further increase in the etching depth, the signal intensity values may start to reduce. Conversely, the signal intensity values on the right side (with greater wavelength values) of characteristic wavelength WL3 may reduce initially with the increase in the etching depth, and may increase when the etching depth exceeds certain point. The trends may be different from structure to structure, and from material to material. By using the collection of the characteristic parameters, a corresponding spectrum may be uniquely identified and its corresponding etching depth may be determined with a one-to-one correspondence.

The trend of the changing of the signal intensity values in response to the increase in the etching depth also provides a way of calculating how much more etching depth and the corresponding etching time may be needed to reach the end point. For example, as may be realized from the above-discussion, once a target etching depth is determined, the target spectrum is also known, and may be found by searching the database 90 using the target etching depth. The target signal strength and the target signal strength ratio may also be determined from the target spectrum. Accordingly, the difference between the current signal strength and the target signal strength, and the difference between the current signal strength ratio and the target signal strength ratio may be used to calculate how much more etching depth is needed, and how much more etching time is needed to reach the end point.

Figure 16:
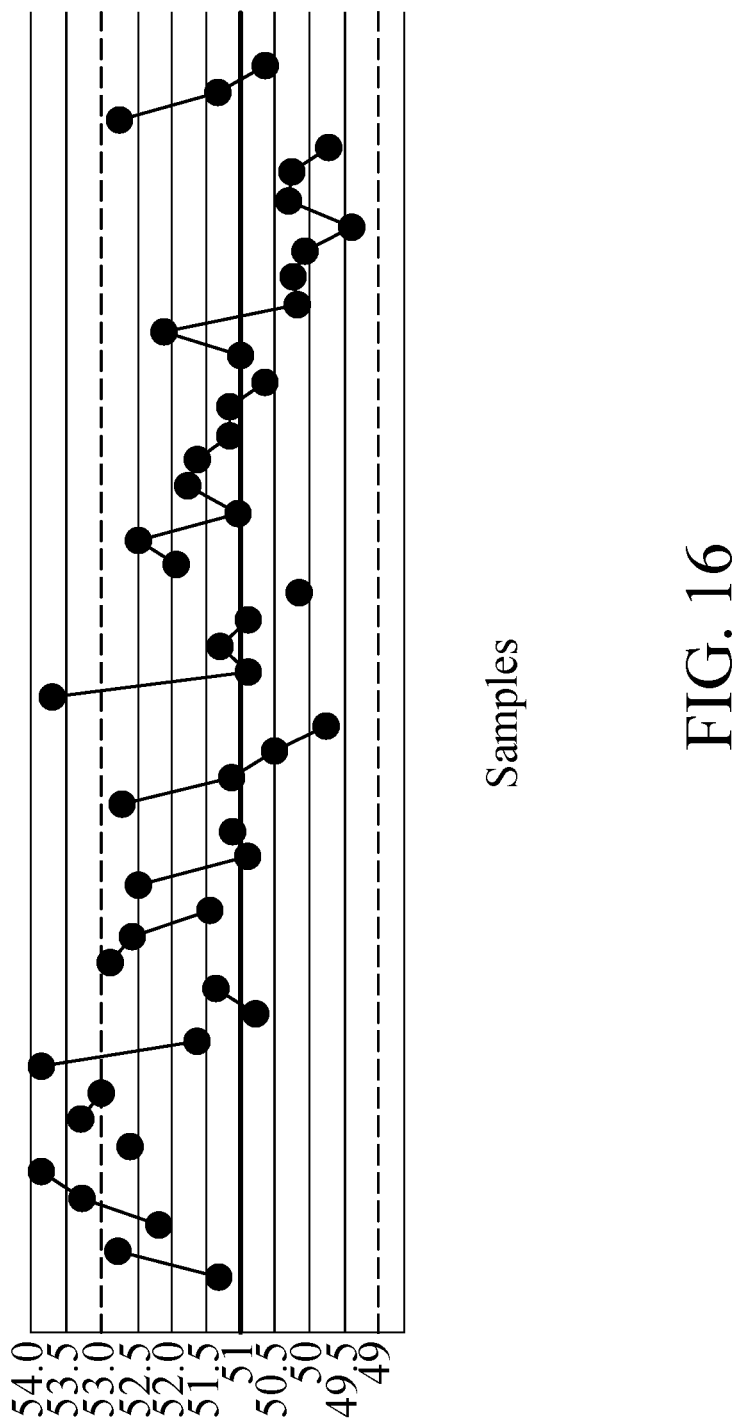
FIG. 16 illustrates the determined end points of multiple samples in accordance with some embodiments.

FIG. 16 illustrates the depths measured from a plurality of sample wafers, which are etched using the end-point determination process in accordance with some embodiments of the present disclosure. It is observed that the etching depths of the plurality of sample wafers are located in the range between about 49.5 and about 54, which are close to each other. FIG. 16 proves that the end-point determination using reflected spectrum provides consistent results.

Figure 17:
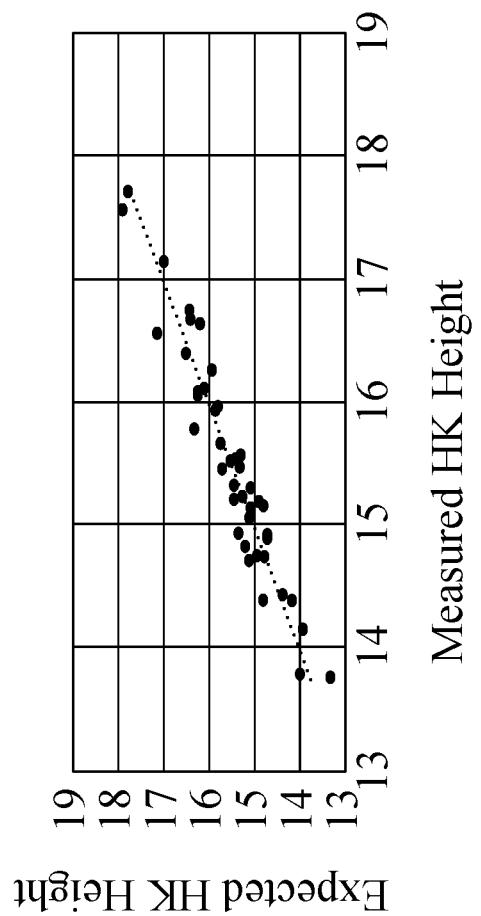
FIG. 17 illustrates the comparison of calculated etching depths and the actual etching depths of multiple sample dielectric fins in accordance with some embodiments.

FIG. 17 illustrates the results obtained from a plurality of samples. The Y-axis represents the expected depths D1 of dielectric regions 36' (FIG. 5), which are also the pre-determined target etching depths that are determined before the corresponding etching processes are started. The X-axis represents the actual depths measured from the etched wafers after the etching processes are stopped. It is observed that the calculated depths and the actual depths are very close to each other. This proves the end-point determination using reflected spectrum is accurate.

Figure 18:
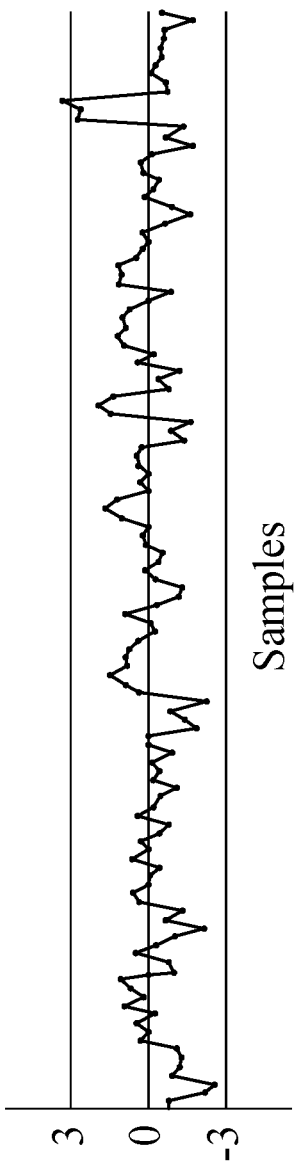
FIG. 18 illustrates the standard deviation of the etching depths of multiple samples that are etched using preset etching recipes to determine end points.
Figure 19:
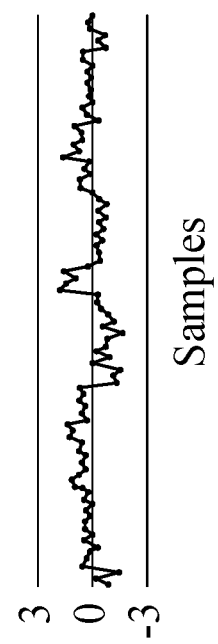
FIG. 19 illustrates the standard deviation of the depths of multiple samples that are etched using spectrums to determine end points in accordance with some embodiments.

FIG. 18 illustrates the results obtained from a first plurality of dielectric regions in a first sample wafer, in which the first plurality of dielectric regions are etched using a conventional end-point determination method. In the etching process, a pre-determined etching recipe is used to etch the first sample wafer, and the etching process is stopped at a predetermined time point. The standard deviation of the etching depths of the first plurality of dielectric regions has one sigma equal to about 1 nm. FIG. 19 illustrates the results obtained from a second plurality of dielectric regions in a second sample wafer, in which the second plurality of dielectric regions are etched using the end-point determination process in accordance with the embodiments of the present disclosure. The standard deviation of the etching depths of the second plurality of dielectric regions has one sigma equal to about 0.6 nm. Accordingly, the within-wafer uniformity in the second sample wafer is improved by 40 percent compared to the first sample wafer.

FIG. 21 illustrates a more detailed process flow 300, in which the process for constructing the model (in model center 92, FIG. 11) and database 90 is discussed. In process 301, a plurality of experimental sample wafers are provided. In process 302, an experimental sample wafer is measured, so that its geographical information such as the etching depth of dielectric regions 36' (FIG. 5) is collected. Next, the experimental wafer is etched, as shown as process 304. When the etching is finished, but before the experiment wafer is taken out of the etching chamber, the reflected spectrum is generated, as shown as process 306. Process 307 shows that the etched sample wafer is measured. For example, the actual etching depth, the width, the length, etc., may be measured. The measured data and the corresponding spectrum are then stored into database 90 as shown in FIG. 11 and process 308. Next, the process loops back to process 302 for a second experimental sample wafer, and the looping is continued until all experiment wafers are etched and measured. The experimental sample wafers may be etched to different etching depths, so that their spectrums may correspond to a range of etching depths that may occur during the etching process.

After the plurality of experimental sample wafers are processed, an algorithm/model may be constructed (process 310), which reflects the relationship between the etching depths and the spectrums. Accordingly, with the model, when a spectrum is obtained, the etching depth corresponding to the spectrum may be determined, and the end point may be determined when the etching depth equals or exceeds the target etching depth. Furthermore, if the etching depth is smaller than the target etching depth, the model may suggest how much more etching depth is needed, and what the respective spectrum looks like (and what their characteristic parameters are).

Next, as shown in process 311, a production wafer is provided. The target etching depth is determined. Accordingly, the target spectrum corresponding to the target etching depth may be determined from the database (process 312). Also, the characteristic parameters of the target spectrum may be determined by searching the database. The geographical data of the production wafer may then be measured (process 313). For example, the actual etching depth at this time may be measured. In process 314, the production wafer is etched. During the etching, the spectrum is generated repeatedly in real-time (process 316), and the generated spectrum is used to determine the current etching depth (process 318). When the etching depth determined from the reflected spectrum is equal to or greater than the pre-determined target etching depth, it is known that the end point is reached, as shown as process 319. The end point determination may also be performed by calculating some characteristic parameters, for example, calculating the signal strength ratios such as SI1/SI3, SI2'/SI3, or the like, and comparing the calculated ratios with the corresponding ratios in the target spectrum. The etching is then stopped, as shown as process 320. Next, as shown in process 322, a post-etching measurement is performed, for example, to measure the actual etching depth. Based on the measurement result and the final spectrum at the end point, the model/algorithm may be updated (process 324). If there are more wafers to be etched (determined by process 326), the process may then loop back to process 311. Otherwise, the process is stopped (process 328).

The embodiments of the present disclosure have some advantageous features. The volume and profile of epitaxy source/drain regions are affected by the height of fin spacers, which are in turn affected by the height of the protruding dielectric fins. The height of the protruding dielectric fins thus needs to be controlled by controlling etching processes. In conventional etching processes, the end points in the etching of the protruding dielectric fins are predetermined, with the etching recipe and etching time being pre-selected. The resulting height of the protruding dielectric fins hence suffers from high process variation. In accordance with the embodiments of the present disclosure, the end point of the etching process is determined in real-time by generating reflected spectrum from the dielectric regions that are etched. The end point determination is thus more accurate, and the volume control of the epitaxy regions is also more accurate.

In accordance with some embodiments of the present disclosure, a method includes determining a target etching depth for etching a plurality of dielectric regions in a wafer, wherein the wafer comprises a plurality of protruding semiconductor fins, and the plurality of dielectric regions between the plurality of protruding semiconductor fins; etching the plurality of dielectric regions; projecting a light beam on the wafer; generating a spectrum from a reflected light reflected from the wafer; determining an end point for etching based on the spectrum, wherein the end point is an expected time point, and the plurality of dielectric regions are etched to the target etching depth; and stopping the etching the plurality of dielectric regions at the end point. In an embodiment, the determining the end point comprises determining a current etching depth of the plurality of dielectric regions using the spectrum; and comparing the current etching depth with a pre-determined target etching depth. In an embodiment, the light beam is projected onto the wafer through a view port of the wafer, and the reflected light is collected and transported to a spectrometer for generating the spectrum. In an embodiment, the determining the end point comprises comparing the spectrum with a plurality of spectrums obtained from a plurality of experimental wafers. In an embodiment, the method further comprises etching the plurality of experimental wafers, wherein the plurality of dielectric regions in the plurality of experimental wafers are etched to different depths; and generating the plurality of spectrums, each from one of the plurality of experimental wafers. In an embodiment, the plurality of dielectric regions comprise a high-k dielectric material. In an embodiment, the light beam has a spectrum in a wavelength range between about 300 nm and about 600 nm. In an embodiment, the method further comprises etching a substrate of the wafer to form a plurality semiconductor strips separated from each other by trenches; depositing a conformal dielectric layer extending into the trenches and on the plurality semiconductor strips; and depositing a dielectric material on the conformal dielectric layer to form the plurality of dielectric regions. In an embodiment, the determining the end point is based on a model, and the method further comprises retrieving the wafer out of the etcher; measuring an end etching depth of the plurality of dielectric regions from the wafer; and updating the model based on a difference between the end etching depth and the target etching depth. In an embodiment, the method further comprises recessing the plurality of protruding semiconductor fins to form recesses; and growing epitaxy semiconductor regions from the recesses. In an embodiment, the method further comprises depositing a spacer layer on the plurality of protruding semiconductor fins and the plurality of dielectric regions; and performing an anisotropic etching process on the spacer layer to form fin spacers on sidewalls of the plurality of protruding semiconductor fins, wherein one of the fin spacers is between one of the plurality of protruding semiconductor fins and one of the plurality of dielectric regions.

In accordance with some embodiments of the present disclosure, a method includes forming a plurality of semiconductor fins protruding out of a bulk substrate; depositing a first dielectric layer conformal to the semiconductor fins; depositing a second dielectric layer into trenches among the semiconductor fins; etching back the second dielectric layer, so that a top surface of the second dielectric layer is lower than top ends of the semiconductor fins; depositing a high-k dielectric layer over the second dielectric layer that has been etched back; etching the high-k dielectric layer in an etcher; during the etching the high-k dielectric layer, collecting a reflected spectrum from the high-k dielectric layer; determining an etching depth of the high-k dielectric layer based on the collected reflected spectrum; and In response to the etching depth reaching a target etching depth, stopping the etching the high-k dielectric layer. In an embodiment, the determining the etching depth comprises comparing the reflected spectrum with a plurality of stored spectrums. In an embodiment, the determining the etching depth comprises calculating characteristic parameters from the collected reflected spectrum; and comparing the characteristic parameters with additional characteristic parameters of the plurality of stored spectrums. In an embodiment, the reflected spectrum covers a wavelength range from about 300 nm to about 600 nm.

In accordance with some embodiments of the present disclosure, an apparatus includes an etcher; a light source optically coupled to the etcher; a light-projecting device configured to project a light beam generated by the light source into the etcher; a spectrometer configured to receive a reflected light from inside the etcher, and to generate a spectrum from the reflected light; a database configured to store the spectrum; and a control unit signally coupled to the etcher, the light source, the spectrometer, and the database. In an embodiment, the control unit is configured to determine an end point of an etching process performed in the etcher based on the spectrum and stored spectrums that are stored in the database. In an embodiment, the etcher comprises a view port, and wherein the light-projecting device is configured to emit the light beam into the etcher through the view port. In an embodiment, the apparatus further comprises a light-receiving device configured to receive the reflected light through a view port, and the spectrometer is configured to receive the reflected light from the light-receiving device. In an embodiment, the control unit comprises a model center storing a model, wherein the model reflects a relationship between geometry information of wafers and reflected spectrums of the wafers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   determining a target etching depth for etching a plurality of dielectric regions in a wafer, wherein the wafer comprises a plurality of protruding semiconductor fins, and the plurality of dielectric regions between the plurality of protruding semiconductor fins;
   etching the plurality of dielectric regions;
   projecting a light beam on the wafer;
   generating a spectrum from a reflected light reflected from the wafer;
   determining an end point for etching based on the spectrum, wherein the end point is an expected time point, and the plurality of dielectric regions are etched to the target etching depth; and
   stopping the etching the plurality of dielectric regions at the end point.

2. The method of claim 1, wherein the determining the end point comprises:
   determining a current etching depth of the plurality of dielectric regions using the spectrum; and
   comparing the current etching depth with a pre-determined target etching depth.

3. The method of claim 1, wherein the light beam is projected onto the wafer through a view port of the wafer, and the reflected light is collected and transported to a spectrometer for generating the spectrum.

4. The method of claim 1, wherein the determining the end point comprises comparing the spectrum with a plurality of spectrums obtained from a plurality of experimental wafers.

5. The method of claim 4 further comprising:
   etching the plurality of experimental wafers, wherein the plurality of dielectric regions in the plurality of experimental wafers are etched to different depths; and
   generating the plurality of spectrums, each from one of the plurality of experimental wafers.

6. The method of claim 1, further comprising, before etching the plurality of dielectric regions:
   etching a semiconductor substrate in the wafer to form trenches;
   forming a dielectric layer extending into the trenches; and forming the plurality of dielectric regions over the dielectric layer and extending into the trenches.

7. The method of claim 1, wherein the light beam has a spectrum in a wavelength range between about 300 nm and about 600 nm.

8. The method of claim 1 further comprising:
etching a substrate of the wafer to form a plurality semiconductor strips separated from each other by trenches;
depositing a conformal dielectric layer extending into the trenches and on the plurality semiconductor strips; and
depositing a dielectric material on the conformal dielectric layer to form the plurality of dielectric regions.

9. The method of claim 1, wherein the determining the end point is based on a model, and the method further comprises:
measuring an end etching depth of the plurality of dielectric regions; and
updating the model based on a difference between the end etching depth and the target etching depth.

10. The method of claim 1 further comprising:
recessing the plurality of protruding semiconductor fins to form recesses; and
growing epitaxy semiconductor regions from the recesses.

11. The method of claim 1 further comprising:
depositing a spacer layer on the plurality of protruding semiconductor fins and the plurality of dielectric regions; and
performing an anisotropic etching process on the spacer layer to form fin spacers on sidewalls of the plurality of protruding semiconductor fins, wherein one of the fin spacers is between one of the plurality of protruding semiconductor fins and one of the plurality of dielectric regions.

12. A method comprising:
forming a plurality of semiconductor fins protruding out of a bulk substrate;
depositing a first dielectric layer conformal to the semiconductor fins;
depositing a second dielectric layer into trenches among the semiconductor fins;
etching back the second dielectric layer, so that a top surface of the second dielectric layer is lower than top ends of the semiconductor fins;
depositing a high-k dielectric layer over the second dielectric layer that has been etched back;
etching the high-k dielectric layer in an etcher;
during the etching the high-k dielectric layer, collecting a reflected spectrum from the high-k dielectric layer;
determining an etching depth of the high-k dielectric layer based on the collected reflected spectrum; and
in response to the etching depth reaching a target etching depth, stopping the etching the high-k dielectric layer.

13. The method of claim 12, wherein the determining the etching depth comprises comparing the reflected spectrum with a plurality of stored spectrums.

14. The method of claim 13, wherein the determining the etching depth comprises:
calculating characteristic parameters from the collected reflected spectrum; and
comparing the characteristic parameters with additional characteristic parameters of the plurality of stored spectrums.

15. The method of claim 12, wherein the reflected spectrum covers a wavelength range from about 300 nm to about 600 nm.

16. A method comprising:
etching a plurality of dielectric regions of a wafer;
projecting a light beam on the wafer to generate a spectrum from a reflected light reflected from the wafer;
determining an end point for the etching, wherein the end point is determined by processes comparing the spectrum with a plurality of spectrums obtained from a plurality of experimental wafers; and
stopping the etching the plurality of dielectric regions when the end point is reached.

17. The method of claim 16, wherein the determining the end point comprises:
determining a current etching depth of the plurality of dielectric regions using the spectrum; and
comparing the current etching depth with a pre-determined target etching depth.

18. The method of claim 16, wherein the light beam is projected onto the wafer through a view port of the wafer.

19. The method of claim 18, wherein the reflected light is collected and transported to a spectrometer for generating the spectrum.

20. The method of claim 16, wherein the processes for determining the end point comprises:
calculating a ratio of a first signal intensity at a first wavelength to a second signal intensity at a second wavelength, wherein the first signal intensity and the second signal intensity are obtained from the spectrum.

* * * * *